(12) United States Patent
Takahashi

(10) Patent No.: US 8,536,457 B2
(45) Date of Patent: Sep. 17, 2013

(54) MULTILAYER WIRING BOARD AND METHOD FOR MANUFACTURING THE SAME

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 118 days.

(21) Appl. No.: 12/453,627

(22) Filed: May 18, 2009

(65) Prior Publication Data

US 2009/0283301 A1  Nov. 19, 2009

Related U.S. Application Data

(60) Provisional application No. 61/071,789, filed on May 19, 2008.

(51) Int. Cl.
*H05K 1/00* (2006.01)
*H05K 1/11* (2006.01)
*H05K 3/36* (2006.01)
*H05K 3/20* (2006.01)

(52) U.S. Cl.
USPC ........... 174/254; 174/250; 174/262; 361/749; 361/751; 29/830; 29/831

(58) Field of Classification Search
USPC ......... 174/262, 250–255; 361/760, 749–751; 29/830, 831
See application file for complete search history.

(56) References Cited

U.S. PATENT DOCUMENTS

| | | | | |
|---|---|---|---|---|
| 3,471,348 A * | 10/1969 | Shaheen et al. | ................. | 216/18 |
| 4,338,149 A * | 7/1982 | Quaschner | ................... | 156/248 |
| 4,687,695 A * | 8/1987 | Hamby | ......................... | 428/192 |
| 5,206,463 A * | 4/1993 | DeMaso et al. | ............... | 174/254 |
| 6,281,446 B1 | 8/2001 | Sakamoto et al. | | |
| 6,342,682 B1 * | 1/2002 | Mori et al. | ................... | 174/262 |
| 2001/0010303 A1 * | 8/2001 | Caron et al. | ..................... | 216/18 |
| 2002/0140076 A1 * | 10/2002 | Yamazaki et al. | ............ | 257/686 |
| 2005/0243528 A1 * | 11/2005 | Murayama | .................... | 361/760 |
| 2006/0042826 A1 * | 3/2006 | Kondo | ......................... | 174/255 |
| 2006/0169485 A1 * | 8/2006 | Kawaguchi et al. | .......... | 174/254 |
| 2006/0213683 A1 * | 9/2006 | Myoung et al. | ............... | 174/255 |
| 2007/0012475 A1 * | 1/2007 | Kawaguchi et al. | .......... | 174/255 |
| 2007/0202306 A1 * | 8/2007 | Nikaldo et al. | ............ | 428/195.1 |

(Continued)

FOREIGN PATENT DOCUMENTS

| CN | 1723747 | 1/2006 |
|---|---|---|
| JP | 5-075270 | 3/1993 |

(Continued)

OTHER PUBLICATIONS

Machine Translation of JP 2006073819A; Printed Board and Method for Manufacturing the Same; Mar. 2006.*

*Primary Examiner* — Timothy Thompson
*Assistant Examiner* — Sherman Ng
(74) *Attorney, Agent, or Firm* — Oblon, Spivak, McClelland, Maier & Neustadt, L.L.P.

(57) ABSTRACT

A wiring board including a main substrate having a base material and a conductive pattern formed on the base material, and a flex-rigid printed wiring board provided to the main substrate and having a rigid substrate and a flexible substrate connected to each other. The flex-rigid printed wiring board has a conductive pattern formed on the rigid substrate and/or the flexible substrate. The conductive pattern of the main substrate is electrically connected to the conductive pattern of the flex-rigid printed wiring board.

15 Claims, 22 Drawing Sheets

(56) References Cited

U.S. PATENT DOCUMENTS

| | | | |
|---|---|---|---|
| 2007/0281505 A1* | 12/2007 | Kobayashi et al. | 439/69 |
| 2008/0047135 A1* | 2/2008 | Arnold | 29/829 |
| 2008/0093118 A1 | 4/2008 | Takahashi et al. | |
| 2008/0289859 A1* | 11/2008 | Mikado et al. | 174/254 |

FOREIGN PATENT DOCUMENTS

| | | |
|---|---|---|
| JP | 7-193370 | 7/1995 |
| JP | 2004-266236 | 9/2004 |
| JP | 2004-266238 | 9/2004 |
| JP | 2006073819 A * | 3/2006 |
| JP | 3795270 B | 4/2006 |
| TW | 200410621 A | 6/2004 |
| TW | 243396 B | 11/2005 |
| TW | 200603704 A | 1/2006 |
| TW | 249764 B | 2/2006 |
| WO | 2004/064468 A1 | 7/2004 |
| WO | 2004/064469 A1 | 7/2004 |

* cited by examiner

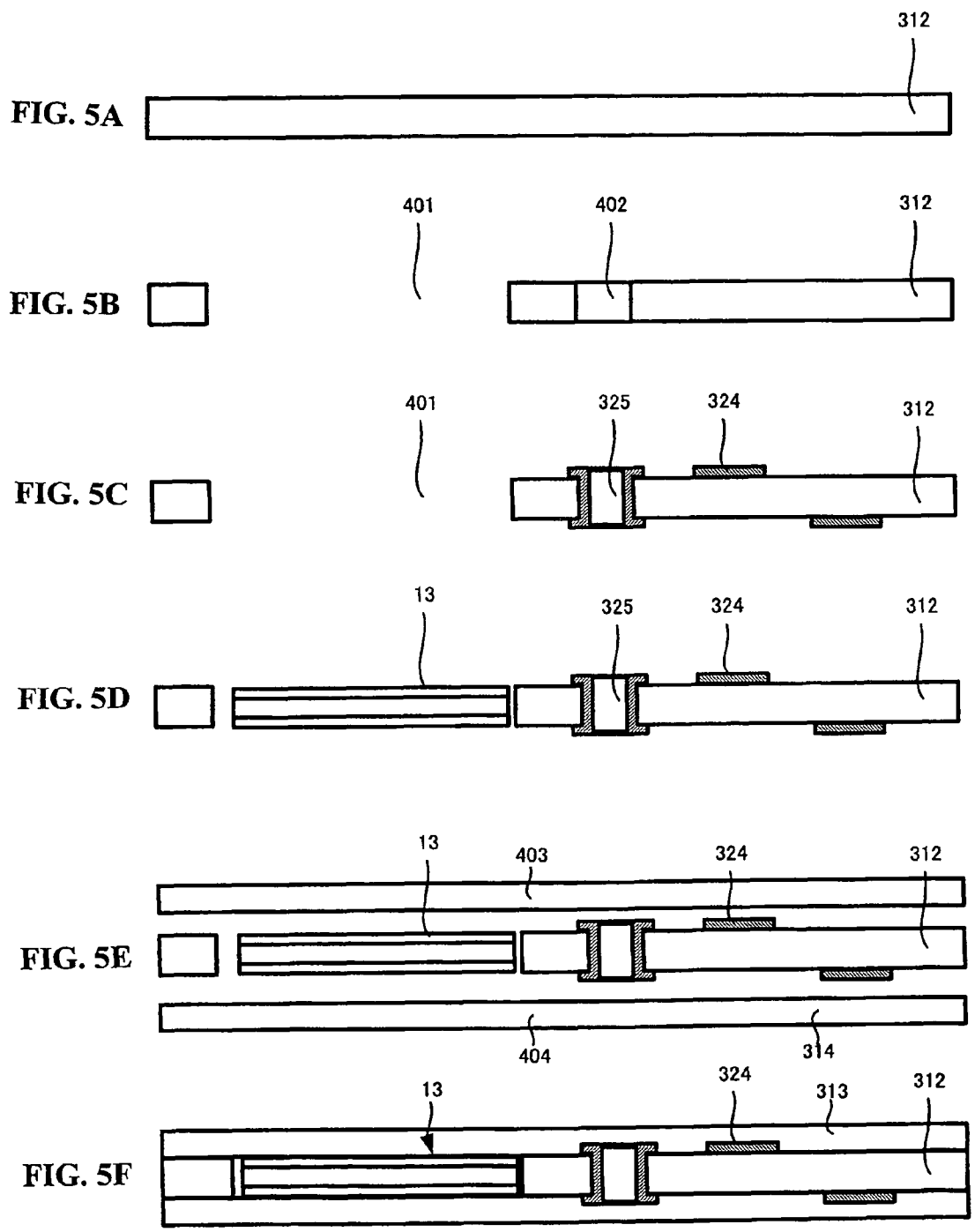

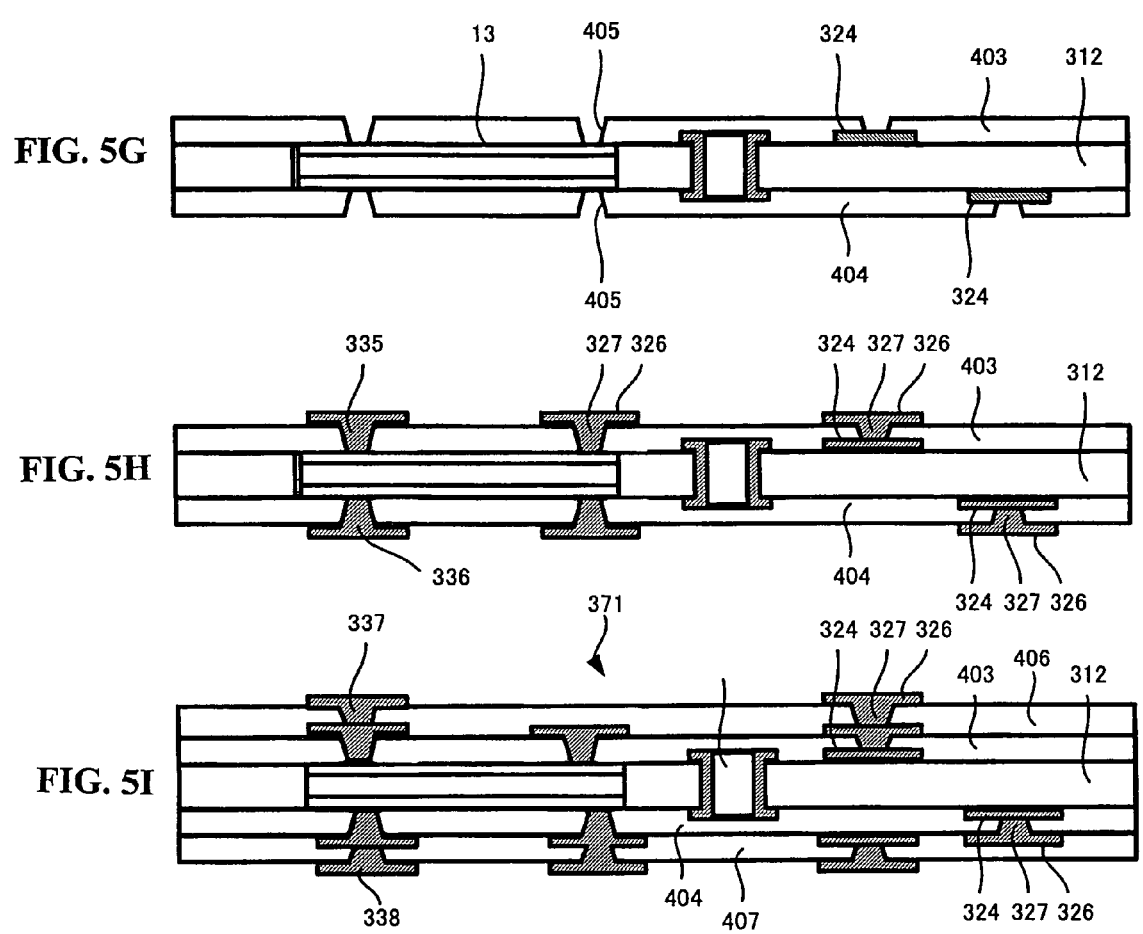

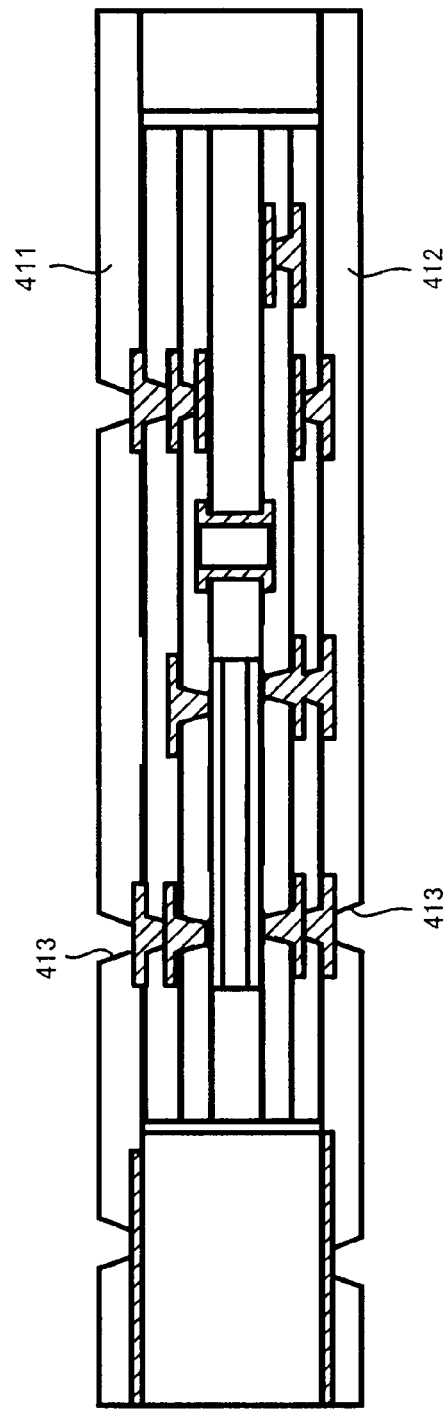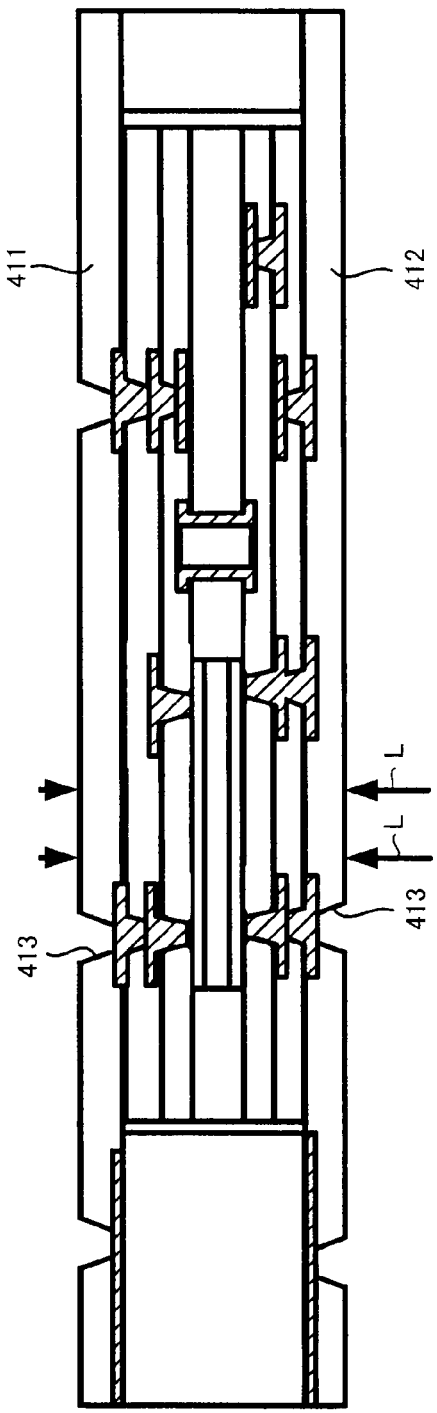
FIG. 6C  FIG. 6D

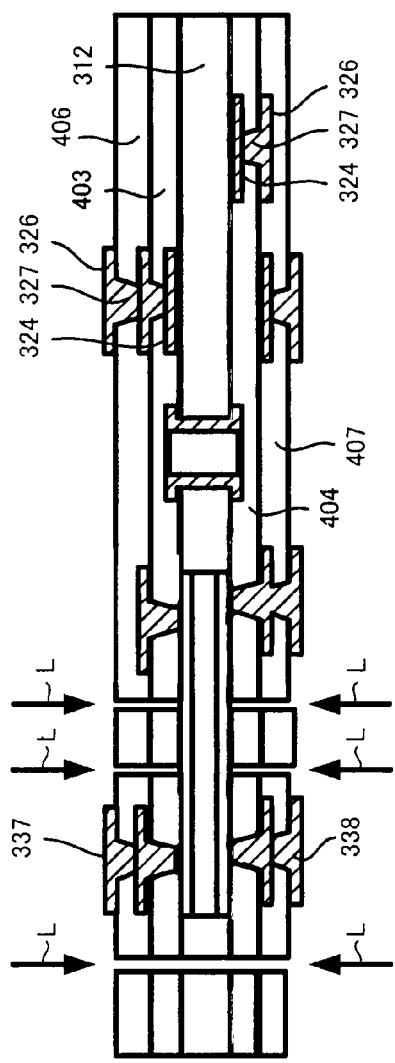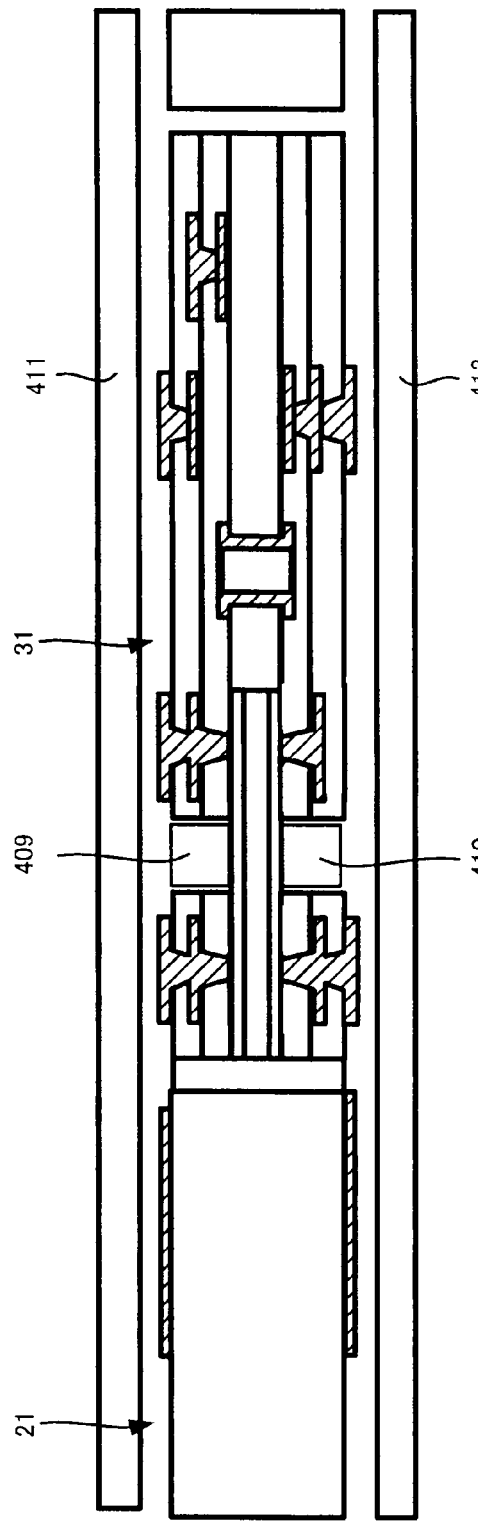
FIG. 18A
FIG. 18B

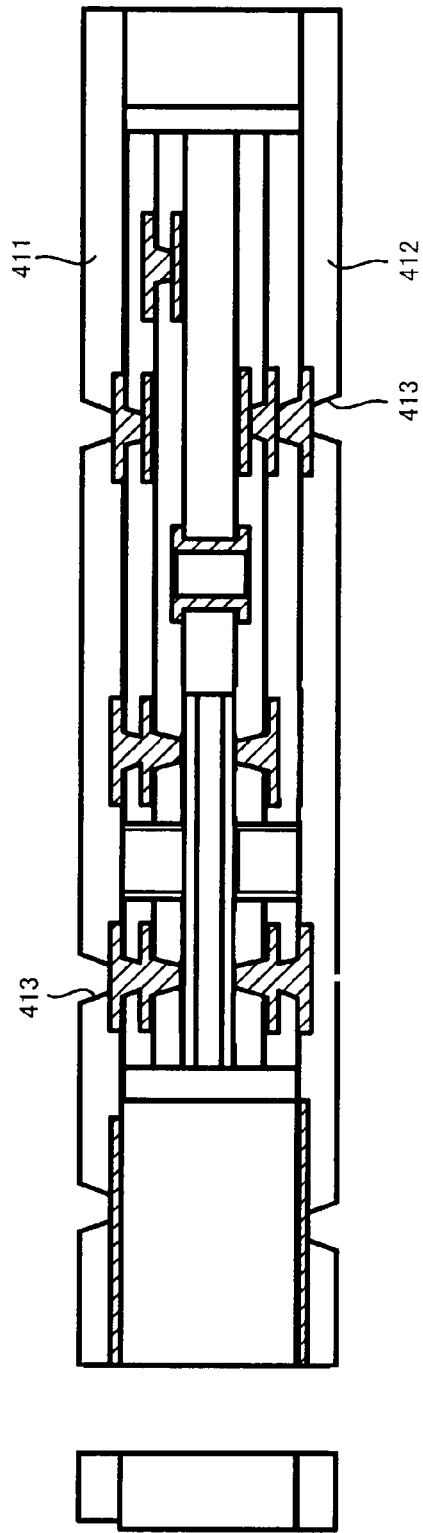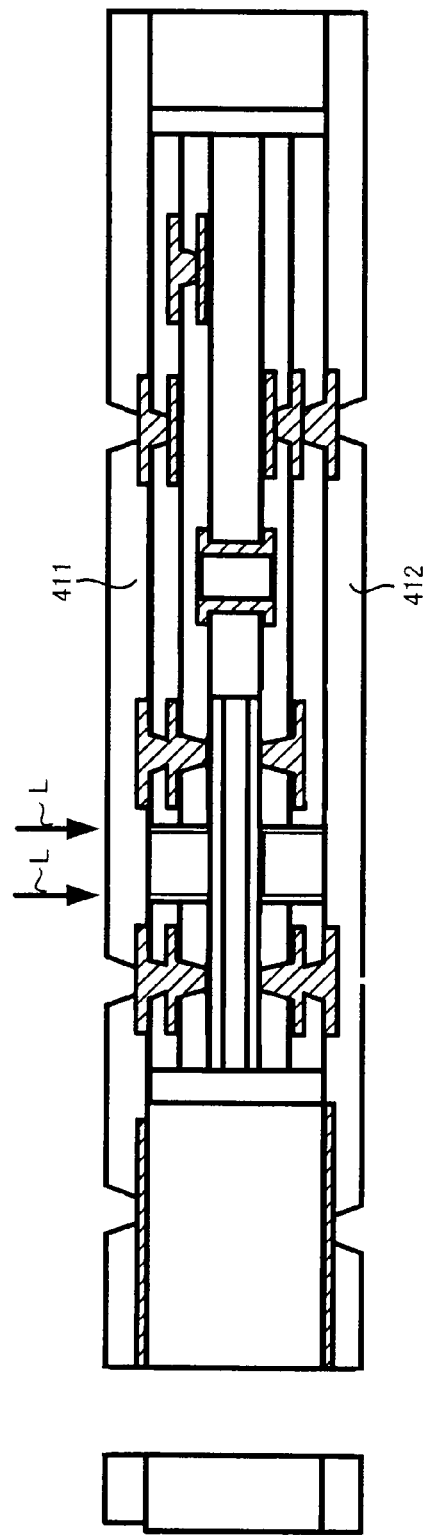
FIG. 18C
FIG. 18D

MULTILAYER WIRING BOARD AND METHOD FOR MANUFACTURING THE SAME

CROSS-REFERENCE TO RELATED APPLICATIONS

The present application claims the benefits of priority to U.S. Application No. 61/071,789, filed May 19, 2008. The contents of that application are incorporated herein by reference in their entirety.

BACKGROUND OF THE INVENTION

1. Field of the Invention

The present invention is related to a wiring board and its manufacturing method.

2. Discussion of the Background

An example of a multilayer wiring board and its manufacturing method is described in Japanese Patent No. 3795270. Also, a flex-rigid printed wiring board, part of whose substrate is rigid and another part is flexible, is described in, for example, Japanese Patent Laid-Open Publication H7-193370. The contents of these publications are incorporated herein by reference in their entirety.

SUMMARY OF THE INVENTION

According to one aspect of the present invention, a wiring board includes a main substrate having a base material and a conductive pattern formed on the base material, and a flex-rigid printed wiring board provided to the main substrate and having a rigid substrate and a flexible substrate connected to each other. The flex-rigid printed wiring board has a conductive pattern formed on the rigid substrate and/or the flexible substrate. The conductive pattern of the main substrate is electrically connected to the conductive pattern of the flex-rigid printed wiring board.

According to another aspect of the present invention, a method for manufacturing a wiring board includes forming a main substrate having a base material and a conductive pattern formed on the base material, forming a flex-rigid printed wiring board provided to the main substrate and having a rigid substrate and a flexible substrate connected with each other, the flex-rigid printed wiring board having a conductive pattern formed on the rigid substrate and/or the flexible substrate, and electrically connecting the conductive pattern of the main substrate and the conductive pattern of the flex-rigid printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is a cross-sectional view of a main substrate, and FIG. 2B is a cross-sectional view of a flex-rigid printed wiring board;

FIGS. 5A-5I are views to illustrate a method for manufacturing a multilayer wiring board, the cross-sectional views showing the steps for manufacturing a flex-rigid printed wiring board;

FIGS. 6A-6F are views to illustrate a method for manufacturing a multilayer wiring board, the cross-sectional views showing the manufacturing steps after a main substrate and a flex-rigid printed wiring board have been put together;

FIGS. 18A-18F are cross-sectional views to illustrate another example of the method for manufacturing a multilayer wiring board.

DETAILED DESCRIPTION OF THE EMBODIMENTS

Figure 1:
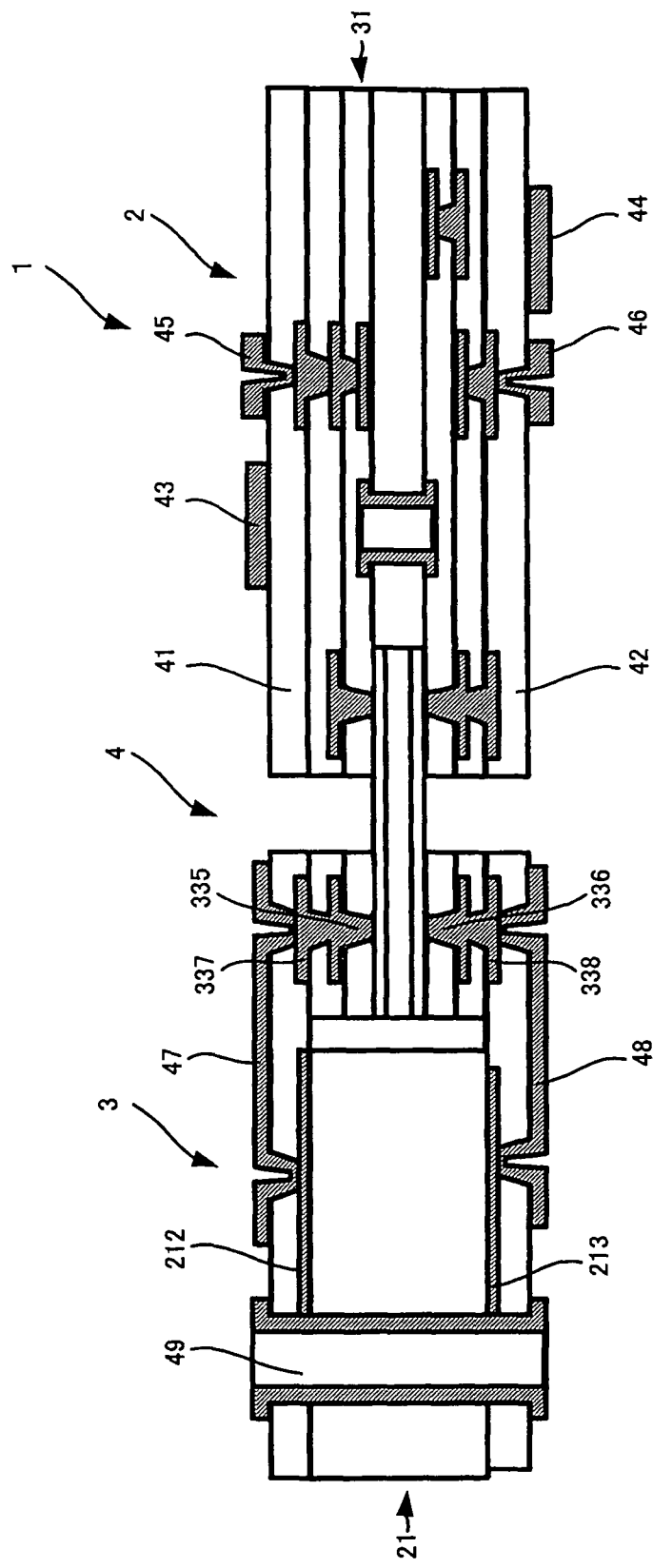
FIG. 1 is a cross-sectional view showing a structure of a multilayer wiring board according to an embodiment of the present invention.

The embodiments will now be described with reference to the accompanying drawings, wherein like reference numerals designate corresponding or identical elements throughout the various drawings.

Multilayer wiring board 1 according to the present embodiment has a structure as a cross-sectional view shows in FIG. 1; it has rigid sections 2, 3 and flexible section 4, and collectively functions as a flex-rigid printed wiring board.

Figures 2A, 2B:
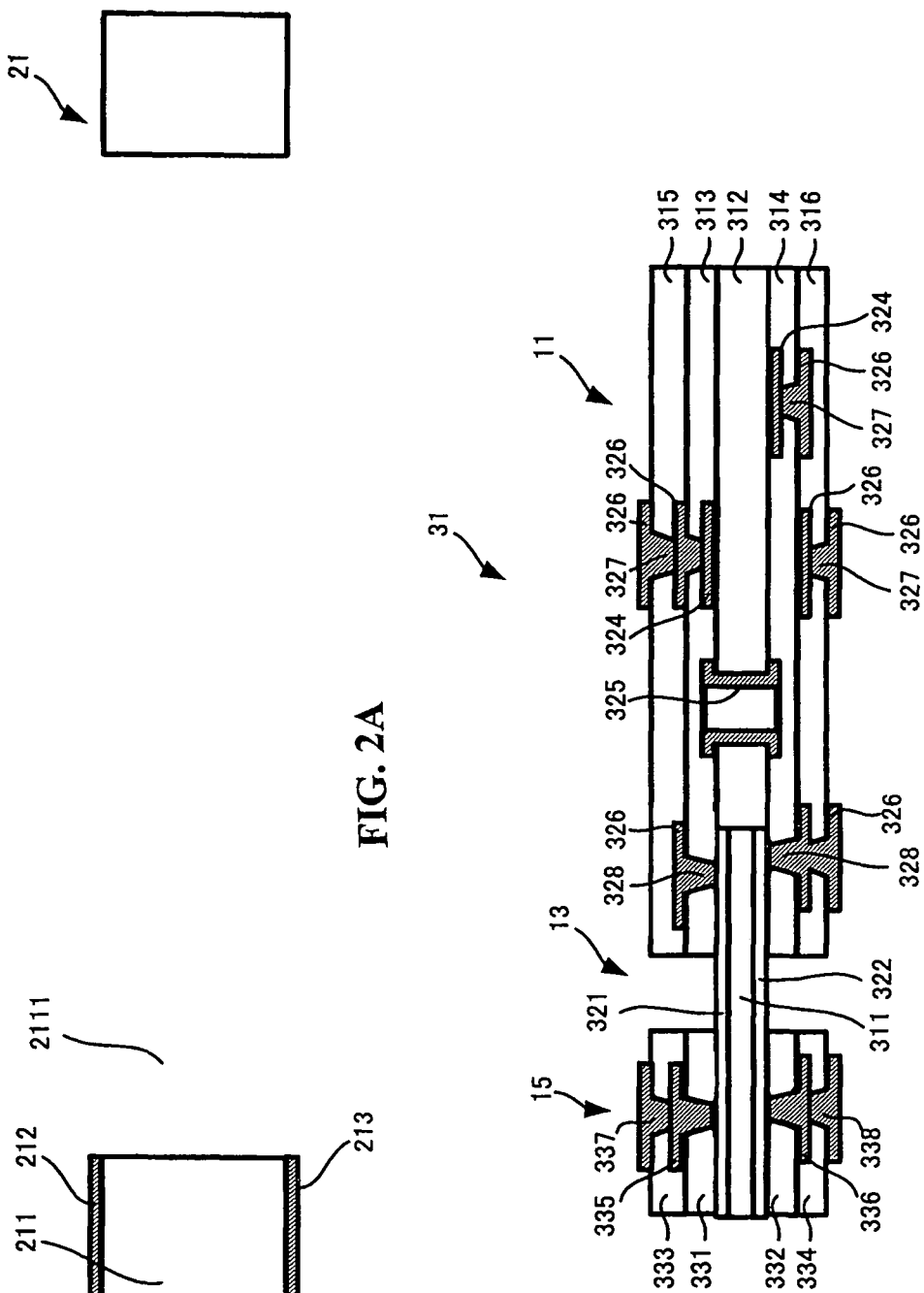
FIGS. 2A and 2B are views showing a part of the multilayer wiring board shown in FIG. 1, where

Multilayer wiring board 1 is structured by putting together main substrate 21 shown in FIG. 2A and flex-rigid printed wiring board 31 shown in FIG. 2B.

Main substrate 21 is made up of core base material 211 and circuit patterns 212, 213 formed on both surfaces of core base material 211.

Core base material 211 is formed with, for example, a non-flexible insulative material such as glass-epoxy resin containing an inorganic substance such as glass cloth or glass filler, and has opening 2111 in which to inset flex-rigid printed wiring board 31. Circuit patterns 212, 213 are circuit patterns made of a conductor such as copper.

Flex-rigid printed wiring board 31 has flexible base material 311 and rigid (non-flexible) base material 312 positioned horizontal to flexible base material 311, and is inset in opening 2111 formed in main substrate 21.

Flexible base material 311 is formed with an insulative flexible sheet, for example, a polyimide sheet with an approximate thickness of 20-50 μm. Rigid base material 312 is set to have substantially the same thickness as flexible base material 311 and is formed with, for example, a non-flexible insulative material such as glass-epoxy resin containing an inorganic substance such as glass cloth or glass filler.

Insulation layers 313, 314 are disposed to sandwich flexible base material 311 and rigid base material 312. Insulation layers 313, 314 cover part of flexible base material 311 and rigid base material 312 and expose the other part of flexible base material 311.

Insulation layers 315, 316 are laminated on insulation layers 313, 314. Insulation layers 313-316 are formed by setting prepreg and have, for example, an approximate thickness of 50-100 μm.

On both surfaces of flexible base material 311, conductive patterns 321, 322 made of copper or the like. Accordingly, flexible substrate 13 is formed.

On both surfaces of rigid base material 312, conductive patterns 324 made of copper or the like are formed.

Conductive patterns 324 formed on both surfaces of rigid base material 312 are connected with each other by means of through-holes 325 having plated interiors. Also, conductive pattern 326 is formed on each of insulation layers 313-316. Conductive patterns 324, 326 formed on different layers are connected to each other by means of filled vias 327.

The insulation layers, conductive (circuit) patterns and vias (via holes) laminated on rigid base material 312 make up rigid substrate 11 having multilayer conductive patterns.

Also, conductive patterns 326 formed on insulation layers 313, 314 are connected through filled vias 328 to a tip of conductive patterns 321, 322 structuring flexible substrate 13.

Insulation layers 331-334 are laminated at a tip of flexible base material 311 to form joint section 15. In insulation layers 331, 332, built-up filled vias 335, 336 connected to conductive patterns 321, 322 are formed and connection pads 337, 338 are formed on the outermost layers.

Main substrate 21 and flex-rigid printed wiring board 31 are positioned adjacent to each other and sandwiched by insulation layers 41, 42 as shown in FIG. 1. Conductive patterns 43, 44 are formed in insulation layers 41, 42 and connected to the inner-layer conductive patterns through vias 45, 46 according to requirements.

Specifically, conductive patterns 212, 213 of main substrate 21 and connection pads 337, 338 at joint section 15 of flex-rigid printed wiring board 31 are connected to each other through conductive patterns 47, 48. Also, conductive patterns 212, 213 of main substrate 21 are connected to each other, for example, by means of copper-plated through-hole 49. In doing so, conductive patterns of main substrate 21 and conductive patterns of flex-rigid printed wiring board 31 are electrically connected.

In such a structure, the wiring density (the number of layers of the conductive patterns, the density of vias, etc.) of flex-rigid printed wiring board 31 is set higher than the wiring density of main substrate 21.

More specifically describing, in the structure shown in FIG. 1, the number of wiring layers where the conductive patterns are formed in flex-rigid printed wiring board 31 is six (6), indicating that more layers are formed than in main substrate 21, where the number of wiring layers formed in the region that has the same thickness as flex-rigid substrate 31 is two (2). Also, in flex-rigid printed wiring board 31, the existing density of conductive (circuit) patterns 324-328 on insulation layers 313-316 is set higher than the existing density of conductive patterns 212, 213 on insulation layer (core base material) 211 of main substrate 21. Also, the average number of vias per insulation layer formed in flex-rigid printed wiring board 31 is set greater than the average number (0) of vias per insulation layer of insulation layer 211 of main substrate 21. As such, in the structure shown in FIG. 1, flex-rigid printed wiring board 31 has a higher wiring density than main substrate 21. In such a case, defects during the manufacturing process may tend to occur more in flex-rigid printed wiring board 31 than in main substrate 21.

According to such a structure and its manufacturing method, when defects occur in flex-rigid printed wiring board 31, defect-free multilayer wiring board 1 may be produced by using another defect-free flex-rigid printed wiring board 31. Accordingly, productivity may increase compared with conventional ones.

Also, the rigidity of main substrate 21 is higher than the rigidity of rigid bodies 11, 15 of flex-rigid printed wiring board 31. Therefore, highly integrated flex-rigid printed wiring board 31 is protected by main substrate 21.

Next, a method for manufacturing multilayer wiring substrate 10 having such a structure is described.

Multilayer wiring board 1 is formed by separately manufacturing main substrate 21 and flex-rigid printed wiring board 31, connecting them and integrating them.

Figure 4A:
FIGS. 4A-4C are views to illustrate a method for manufacturing a multilayer wiring board, the cross-sectional views showing the steps to form a main substrate.

When forming main substrate 21, for example, as shown in FIG. 4A, core base material 211 having copper foils 221, 222 on both surfaces, for example, a resin copper film sheet (Resin Cupper Film: RCF), is prepared. Core base material 211 is preferred to be of a size large enough to produce multiple main substrates 21.

Figure 4B:
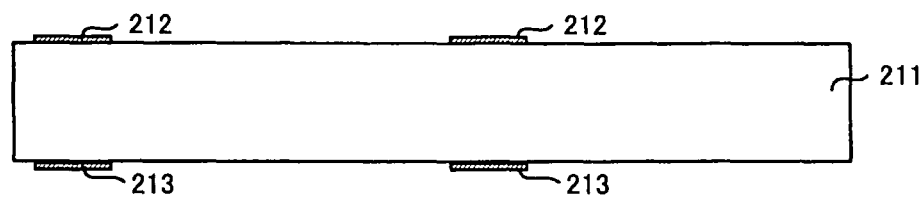

Next, conductive patterns are formed by patterning copper foils 221, 222 as shown in FIG. 4B.

Figure 3A:
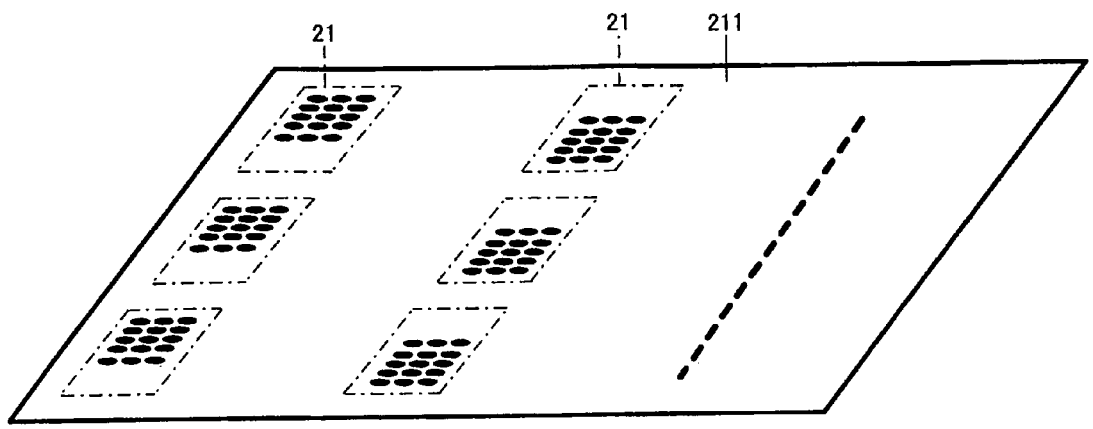
FIG. 3A is a view to illustrate a method for manufacturing a multilayer wiring board, showing a rigid base material on which multiple main substrates are formed.
Figure 3B:
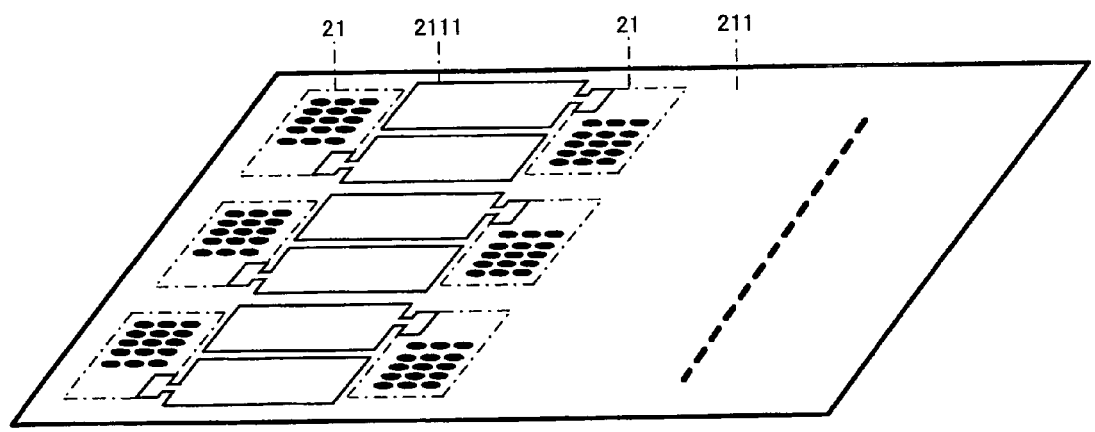
FIG. 3B is a view to illustrate a method for manufacturing a multilayer wiring board, showing a flexible base material on which multiple flex-rigid substrates are formed, and a perspective view to illustrate a production process of a second substrate according to the method for manufacturing the present embodiment.
Figure 4C:
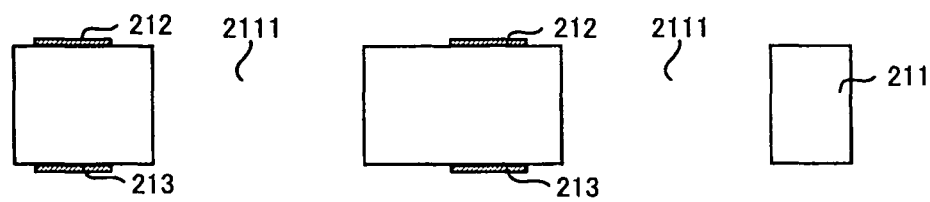

In the following, by conducting a piercing process, laser cut or the like, openings 2111 are formed as shown in FIGS. 3B and 4C to form conductive main substrates 21.

Meanwhile, when forming flex-rigid printed wiring board 31, as shown in FIG. 5A, rigid base material 312 having sufficient size to produce multiple flex-rigid printed wiring boards 31 is prepared first.

Next, as shown in FIG. 5B, rectangular opening 401 for arranging flexible base material 311 and opening 402 for forming through-hole 325 are formed in rigid base material 312.

Next, conductive pattern 324 and through-hole 325 are formed by copper plating and patterning as shown in FIG. 5C.

Then, flexible substrate 13 having conductive patterns 321, 322 formed on both surfaces of flexible base material 311 is arranged in opening 401 as shown in FIG. 5D.

Then, as shown in FIG. 5E, flexible base material 311 and rigid base material 312 are covered by prepregs 403, 404, and pressed as shown in FIG. 5F. Furthermore, the resin contained in prepregs 403, 404 is cured.

Then, as shown in FIG. 5G, via holes 405 are formed in cured prepregs 403, 404 by beaming a laser or the like. Then, the entire surfaces are plated and patterned to form conductive patterns 326 and filled vias 327, 335 as shown in FIG. 5H.

Then, as shown in FIG. 5I, upper-layer prepregs 406, 407 are disposed, on which the same process is conducted as above to cover flexible substrate 13 and rigid base material 312, and then to form upper-layer conductive patterns 326 and filled vias 327, 338. Accordingly, structure 371 is formed.

Figure 3C:
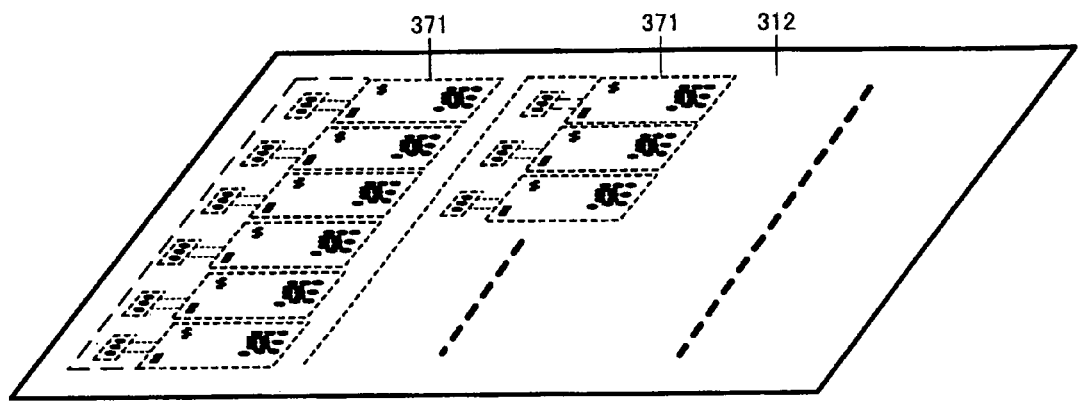
FIG. 3C is a view to illustrate a method for manufacturing a multilayer wiring board, the view showing a phase in which openings are formed to arrange flex-rigid substrates in a rigid base material where multiple main substrates have been formed.

By doing so, as shown in FIG. 3C, multiple structures 371 are formed on a sheet of rigid base material 312.

Then, each structure 371 is cut out.

Figure 3D:
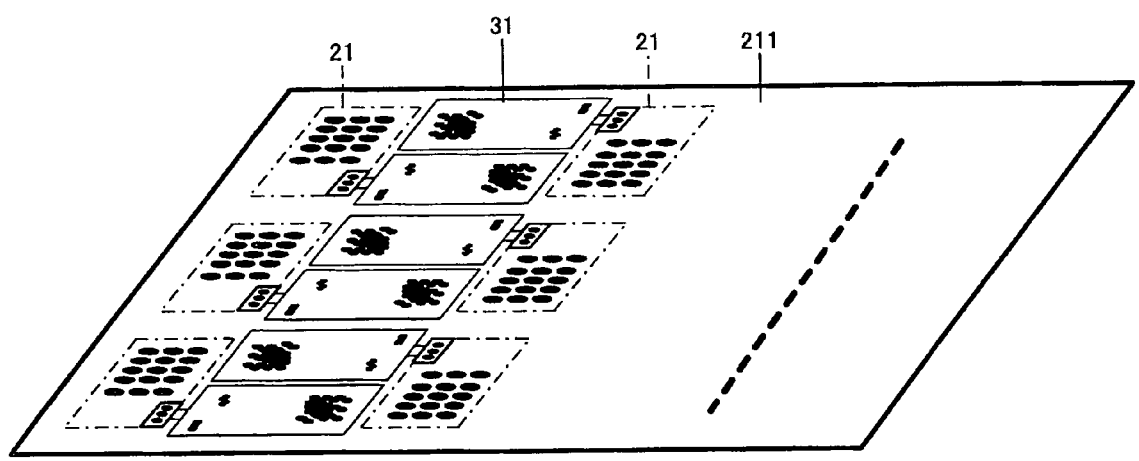
FIG. 3D is a view to illustrate a method for manufacturing a multilayer wiring board, the view showing a phase in which openings are formed to arrange flex-rigid substrates in a rigid base material where multiple main substrates have been formed.
Figure 6A:
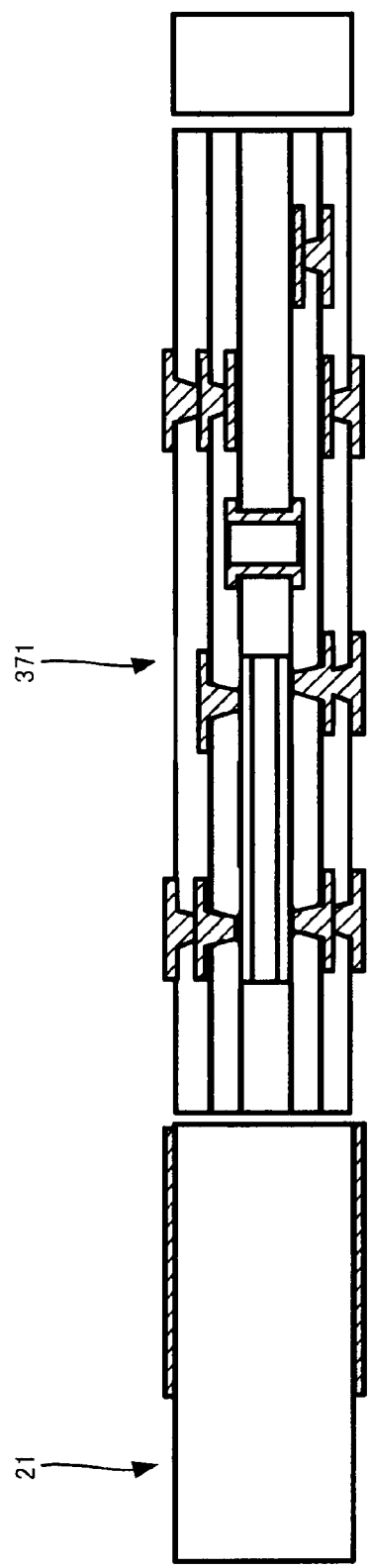

In the following, main substrates 21 and structures 371 are each inspected to select defect-free combinations. Then, as shown in FIGS. 3D and 6A, defect-free structure 371 is arranged in opening 2111 adjacent to defect-free main substrate 21.

Figure 6B:
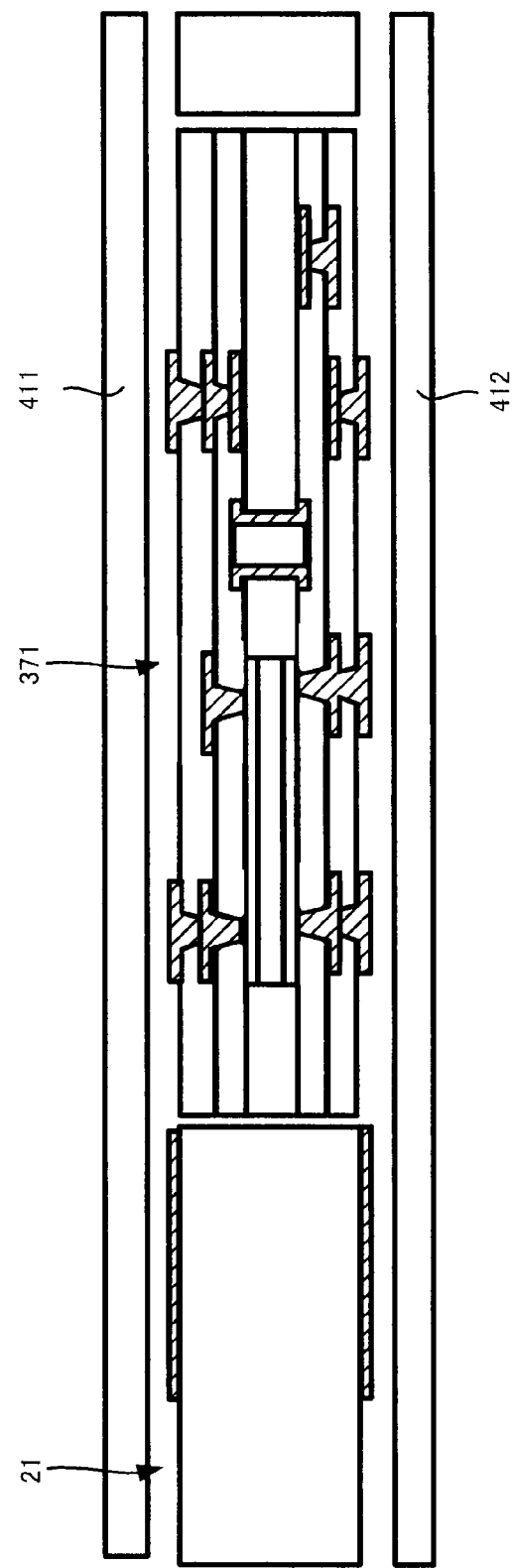

Then, as shown in FIG. 6B, prepregs 411, 412 are disposed on the top and bottom surfaces of multiple combinations of main substrate 21 and structure 371, and pressed. Further, their resins are cured.

Then, by beaming a laser or the like, as shown in FIG. 6C, vias 413 are properly formed in cured prepregs 411, 412. Also, through-holes 414 are formed using a drill or the like.

Figure 6E:
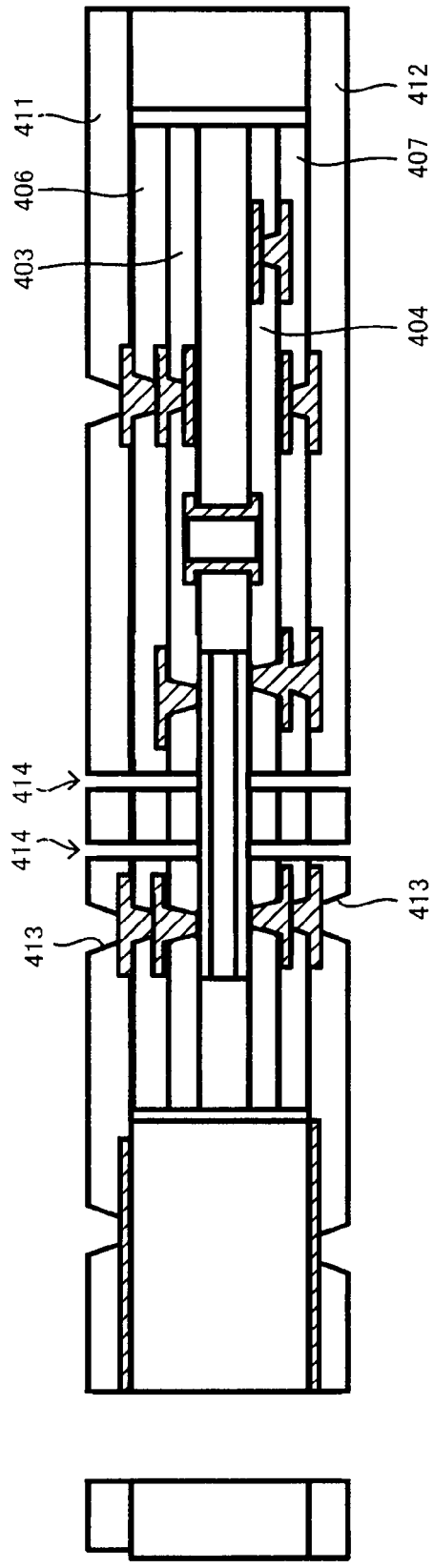
Figure 6F:
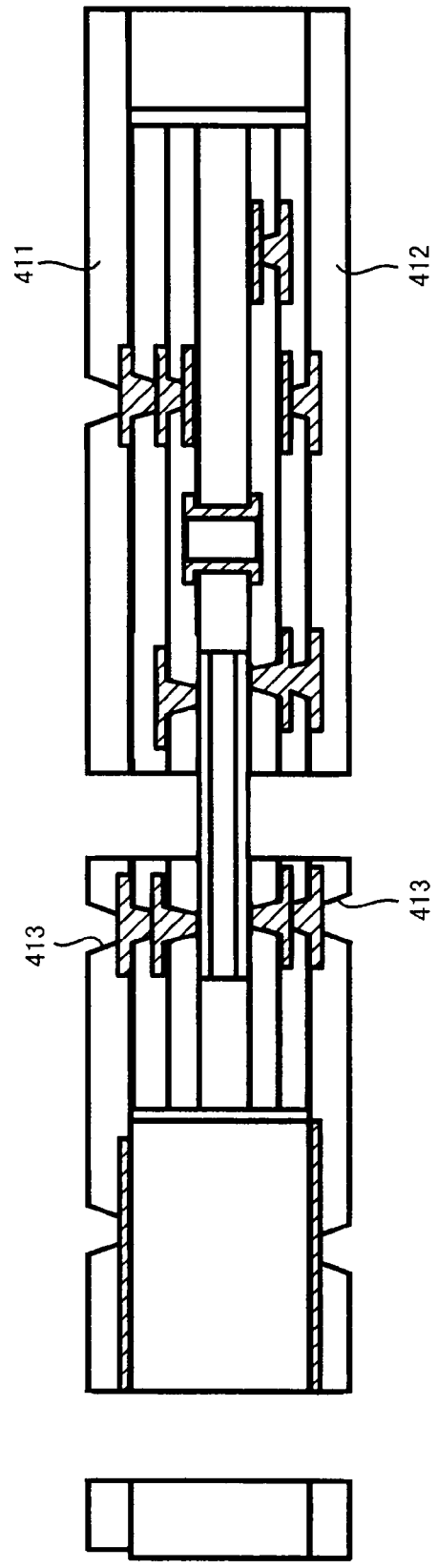

Then, in the areas of cured prepregs 411, 412 which will expose flexible substrate 13, laser (L) is beamed as shown in FIG. 6D, then as shown in FIG. 6E, prepregs 403, 404, 406, 407, 411, 412 are cut. Then, as shown in FIG. 6F, the cut portions are removed.

Then, the entire surfaces are plated and patterned. Accordingly, multilayer wiring board 1 having the structure shown in FIG. 1 is completed.

As described so far, according to a multilayer wiring board of the present embodiment and its manufacturing method, main substrate 21 and flex-rigid printed wiring board 31 may be manufactured separately at least to a certain step, and then a combination of the two defect-free products may be put together to produce a multilayer wiring board. Thus, even if a defect occurs in main substrate 21 or flex-rigid printed wiring board 31, the entire multilayer wiring board 1 will not become defective, but a final product may be produced by replacing the defective unit with a defect-free unit. Accordingly, productivity increases compared with cases in which the entire structure is manufactured collectively as a whole, and thus loss of material or energy may be reduced.

Also, since the rigidity of core 211 of main substrate 21 is higher than that of the insulation layers of the flex-rigid printed wiring board, stresses exerted on flex-rigid printed wiring board 31 may be suppressed.

Since the wiring density of flex-rigid printed wiring board 31 is set higher than that of the main substrate, flex-rigid printed wiring board 31 may be made partially fine-pitched.

Furthermore, since main substrate 21 has no unnecessary joint section for conductors, its tolerance to impact from being dropped improves.

The present invention is not limited to the above embodiment, but various modifications and applications may be employed.

For example, in the above embodiment, main substrate 21 and flex-rigid printed wiring board 31 are arranged side by side; however, main substrate 21 and flex-rigid printed wiring board 31 may be arranged in any way.

Figure 7:
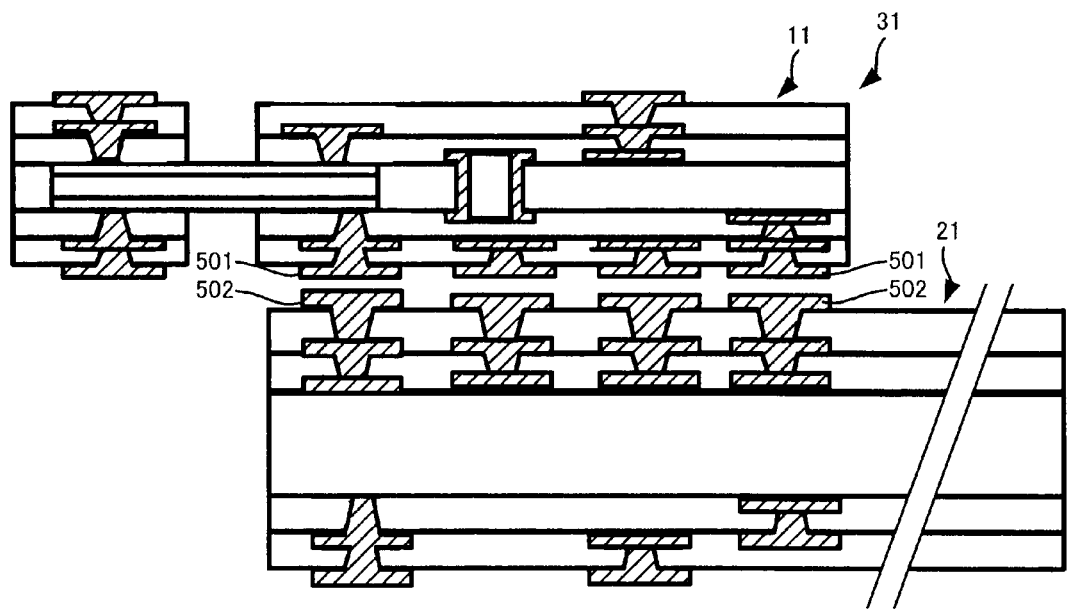
FIG. 7 is a view to illustrate how to put together a main substrate and a flex-rigid substrate, the view showing the structure in which a flex-rigid printed wiring board is arranged on a surface of a main substrate.

For example, as shown in FIG. 7, flex-rigid printed wiring board 31 may be placed on a surface of main substrate 21. In such a case, for example, connection pads 502 formed on a surface (the lower surface) of rigid substrate 11 of flex-rigid printed wiring board 21 may be anchored using solder or the like to connection pads 501 arranged on a surface of main substrate 21.

Figure 8:
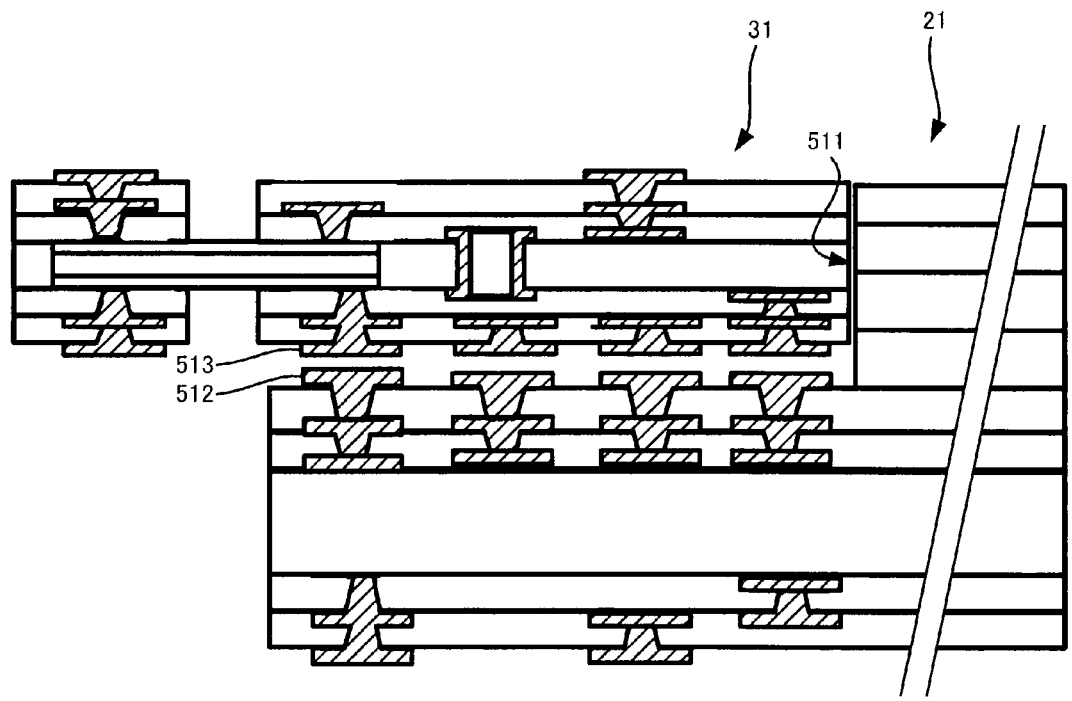
FIG. 8 is a view to illustrate how to put together a main substrate and a flex-rigid substrate, the view showing the structure in which a rigid substrate of a flex-rigid printed wiring board is arranged in an accommodation section of a main substrate.

Also, as shown in FIG. 8, for example, arrangement section (accommodation section) 511 may be formed in main substrate 21 to accommodate part of rigid substrate 11 of flex-rigid printed wiring board 31, and part of rigid substrate 11 of flex-rigid printed wiring board 31 may be arranged in accommodation section 511. In such a case, for example, using solder or the like, connection pads 513 formed in rigid substrate 11 of flex-rigid printed wiring board 31 may be anchored to connection pads 512 formed in accommodation section 511 of main substrate 21.

Figure 9:
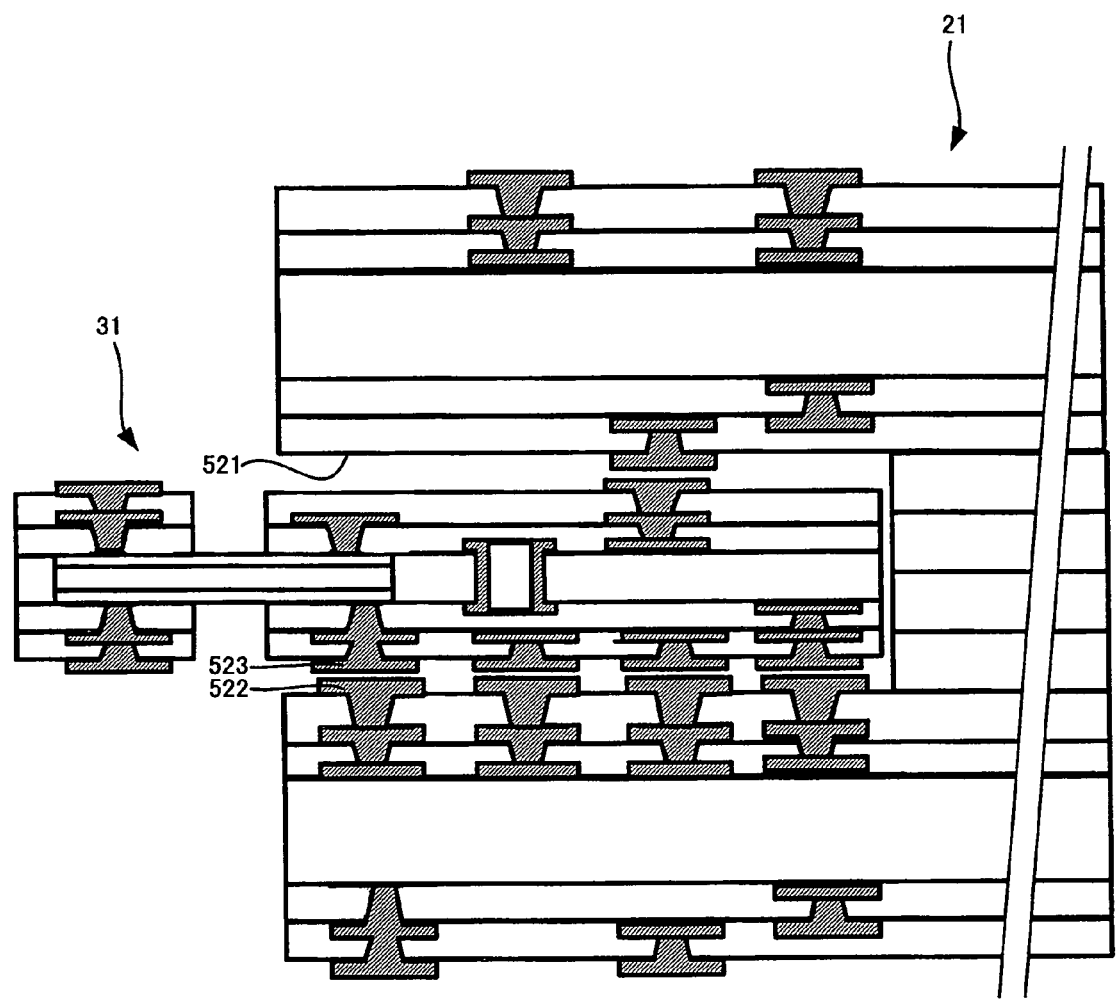
FIG. 9 is a view to illustrate how to put together a main substrate and a flex-rigid substrate, the view showing the structure in which a rigid substrate of a flex-rigid printed wiring board is embedded in a main substrate.

Also, as shown in FIG. 9, for example, rigid substrate 11 of flex-rigid printed wiring board 31 may be arranged to be embedded (inserted, inset) in main substrate 21. In such a case, for example, using solder or the like, connection pads 523 formed in rigid substrate 11 of flex-rigid printed wiring board 21 may be anchored to connection pads 522 formed in hollow section (accommodation section) 521 of main substrate 21.

Figure 10:
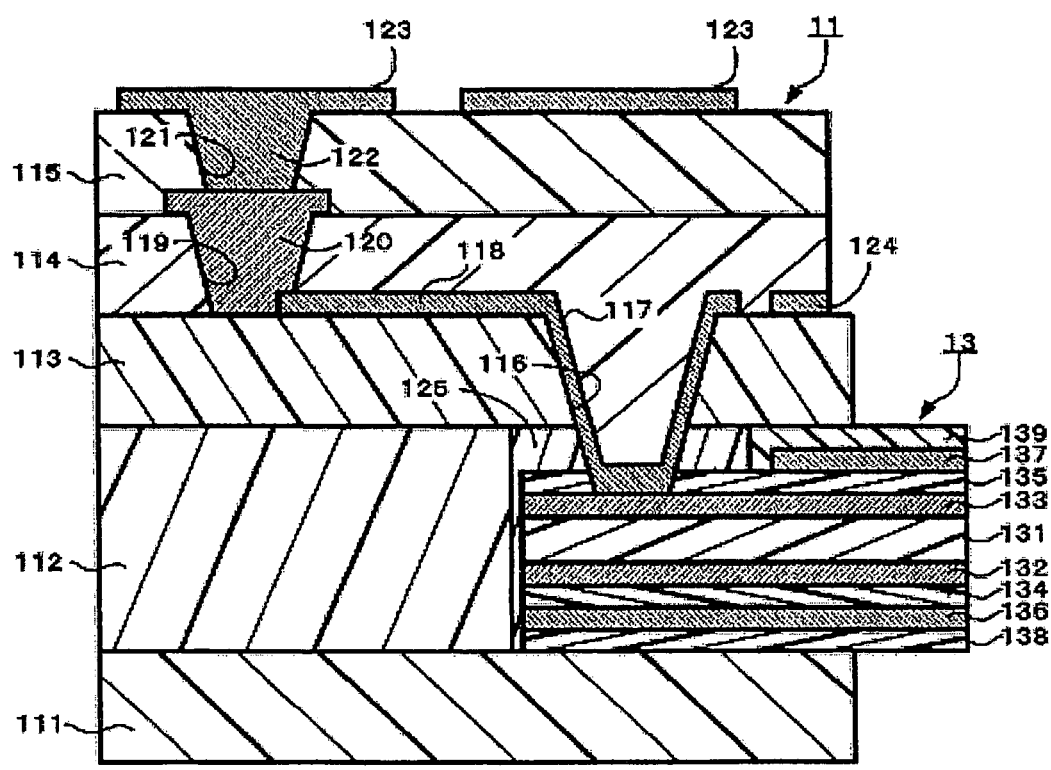
FIG. 10 is a view showing an example of a modified structure of a flex-rigid printed wiring board.

Also, it is effective to manufacture flex-rigid printed wiring board 31 to have such a structure as shown in FIG. 10.

Flexible substrate 13 shown in FIG. 10 has a structure formed by laminating base material 131, conductive layers 132, 133, insulation layers 134, 135, shield layers 136, 137 and coverlays 138, 139.

Base material 131 is formed with an insulative flexible sheet, for example, a polyimide sheet with a thickness in the range of 20-50 μm, preferably with an approximate thickness of 30 μm.

Conductive layers 132, 133 are respectively formed on the front and back surfaces of base material 131 and form striped conductive patterns (13a).

Insulation layers 134, 135 are formed with a polyimide film or the like with an approximate thickness of 5-15 μm and insulate conductive layers 132, 133 from the outside.

Shield layers 136, 137 are formed with a conductive layer, for example, a cured silver paste film, and shield conductive layers 132, 133 from external electromagnetic noise as well as shield electromagnetic noise from conductive layers 132, 133 to the outside.

Coverlays 138, 139 are formed with an insulative film such as polyimide with an approximate thickness of 5-15 μm, and insulate as well as protect entire flexible substrate 13 from the outside.

On the other hand, rigid substrate 11 is formed by laminating first insulation layer 111, non-flexible base material 112, second insulation layer 113, and first and second upper-layer insulation layers 114, 115.

Non-flexible base material 112 is to provide rigidity for rigid substrate 11 and is formed with a non-flexible insulative material such as glass-epoxy resin. Non-flexible base material 112 is positioned horizontal to flexible substrate 13 without touching it. Non-flexible base material 112 has substantially the same thickness as flexible substrate 13, for example, in the range of 50-150 μm, preferably an approximate thickness of 100 μm.

First and second insulation layers 111, 113 are formed by curing prepreg. First and second insulation layers 111, 113 each have a thickness in the range of 50-100 µm, preferably an approximate thickness of 50 µm.

First and second insulation layers 111, 113 cover non-flexible base material 112 and flexible substrate 13 from front- and back-surface sides while exposing part of flexible substrate 13. Also, first and second insulation layers 111, 113 are polymerized with coverlays 138, 139 on the surfaces of flexible substrate 13.

Non-flexible base material 112 and first and second insulation layers 111, 113 form the core of rigid substrate 11 to support rigid substrate 11 as well as to support and anchor flexible substrate 13 by sandwiching its tip.

A gap left in non-flexible base material 112, flexible substrate 13 and first and second insulation layers 111, 113 is filled with resin 125. Resin 125, for example, seeps out from a low-flow prepreg that forms first and second insulation layers 111, 113 during the manufacturing process and is cured to be integrated with first and second insulation layers 111, 113.

Furthermore, in the area of second insulation layer 113 that faces connection pad (13b) of wiring 133 in flexible substrate 13, via (via hole, contact hole) 116 is formed.

In the area of flexible substrate 13 that faces via 116 (the area where connection pad (13b) of conductive layer (13a) is formed), shield layer 137 and coverlay 139 of flexible substrate 13 are removed. Via 116 penetrates insulation layer 135 of flexible substrate 13 and exposes connection pad (13b) of conductive layer 133.

On the inner surface of via 116, conductive pattern (conductive layer) 117 is formed by copper plating or the like. Conductive pattern 117 is connected through plating to connection pad (13b) of conductive layer 133 in flexible substrate 13. Also, via 116 is filled with resin.

On second insulation layer 113, extended pattern 118 connected to conductive pattern 117 is formed. Extended pattern 118 is formed with a copper-plated layer or the like.

Also, at the edge of second insulation layer 113, namely, at the position beyond the border of flexible base material 13 and non-flexible base material 112, copper pattern 124, insulated from the rest, is disposed. Accordingly, heat generated in rigid substrate 11 may be radiated effectively.

First upper-layer insulation layer 114 is laminated on second insulation layer 113. First upper-layer insulation layer 114 is formed by curing a material containing inorganic material, such as a prepreg made by impregnating glass cloth or the like with resin. By making such a structure, tolerance to impact from being dropped may be enhanced. During the step to manufacture such a flex-rigid printed wiring board, resin from the prepreg fills via 116.

Also, on first upper-layer insulation layer 114, second upper-layer insulation layer 115 is disposed. Second upper-layer insulation layer 115 is also formed by curing a prepreg made by impregnating glass cloth or the like with resin.

In first upper-layer insulation layer 114 disposed on second insulation layer 113, via (first upper-layer via) 119 connected to extended pattern 118 is formed. Via 119 is filled with conductor 120 such as copper. Also, in second upper-layer insulation layer 115 laminated on first upper-layer insulation layer 114, via (second upper-layer via) 121 connected to via 119 is formed. Via 121 is filled with conductor 122 such as copper. Namely, filled built-up vias are formed by vias 119, 121.

On second upper-layer insulation layer 115, conductive pattern (circuit pattern) 123 is properly formed. Via 119 is properly connected to conductive pattern 123.

The structure of the connecting area between joint section 15 and flexible substrate 13 may be such as shown in FIG. 10.

In flex-rigid printed wiring board 10 having such a structure, a tip of flexible substrate 13 is sandwiched between first and second insulation layers 111, 113 which form the core section of rigid substrate 11, and is polymerized.

Furthermore, connection pad (13b) of conductive layer 133 in flexible substrate 13 and conductive pattern 123 of rigid substrate 11 are connected by means of conductive pattern (copper-plated layer) 117 formed inside via 116 formed in second insulation layer 113 and insulation layer 135.

Accordingly, stresses exerted on flexible substrate 13 when flexible substrate 13 is bent are not conveyed to the joint section (via 116, wiring-layer pattern 117) of rigid substrate 11. Therefore, stresses exerted on the joint section between rigid substrate 11 and flexible substrate 13 are minor, resulting in high reliability.

Also, conductive layer 133 of flexible substrate 13 and conductive pattern 117 inside via 116 of rigid substrate 11 are connected through plating. Thus, the reliability of the joint section is high.

Furthermore, the interior of via 116 is filled with resin of upper-layer insulation layer 114. Since via 116 is anchored and supported by the resin inside via 116, the connection reliability between via 116 and conductive layer 133 is enhanced.

Also, the edges of insulation layers 113, 111 facing the flexible substrate protrude beyond the edge of upper-layer insulation layer 114 facing the flexible substrate. Therefore, stresses exerted on flexible substrate 13 when flexible substrate 13 is bent are not passed along to the joint section (via 116, conductive pattern 117) of rigid substrate 11. Accordingly, stresses exerted on the joint section between rigid substrate 11 and flexible substrate 13 are minor, resulting in high reliability.

In the above example, to make understanding easier, conductive patterns are formed only on the top surfaces of rigid substrates 11, 12. However, the present invention is not limited to such. For example, as shown in FIG. 11, conductive patterns may also be disposed on the bottom side of rigid substrates 11, 12.

Figure 11:
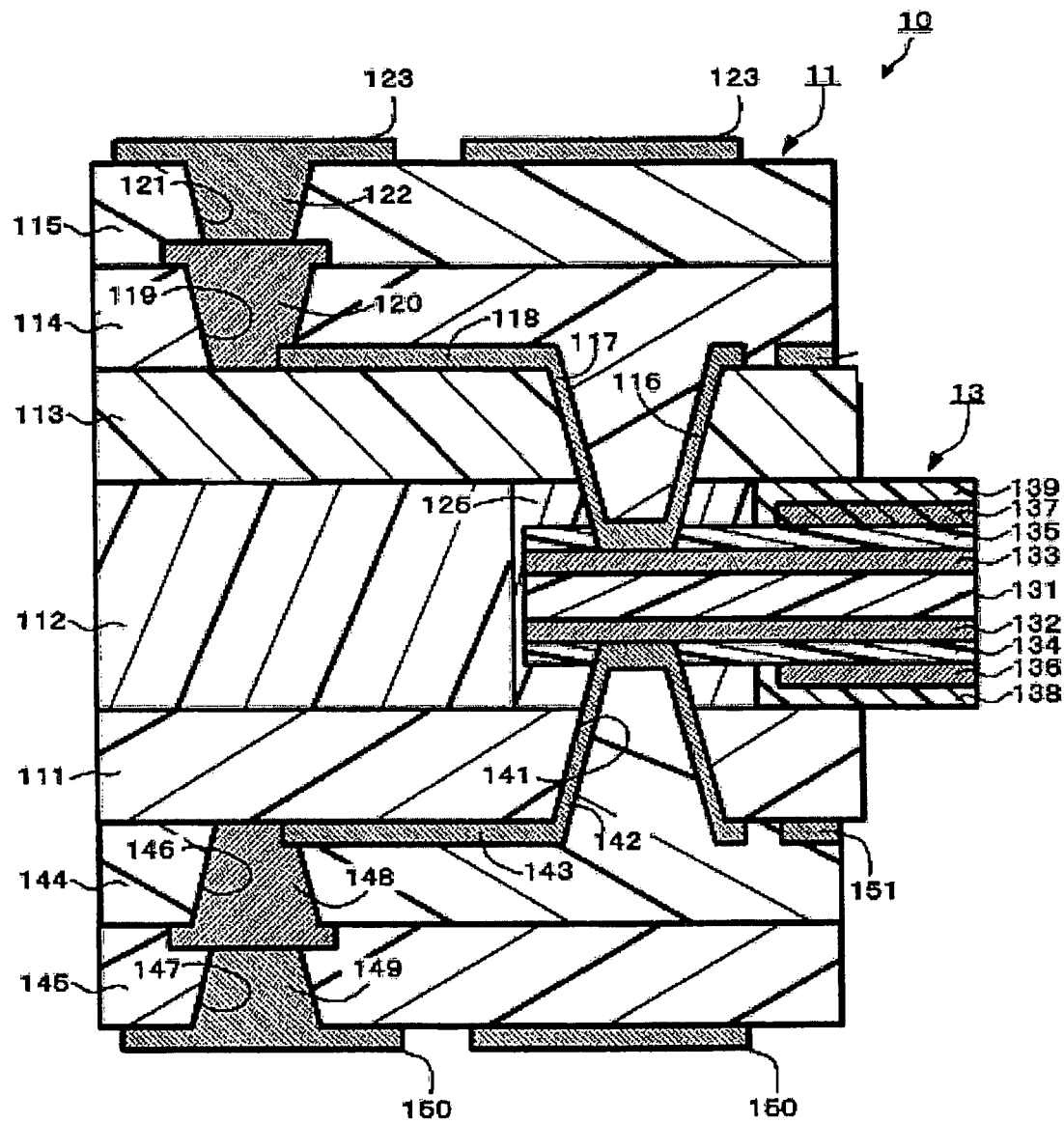
FIG. 11 is a view showing another example of a modified structure of a flex-rigid printed wiring board.

In the structure shown in FIG. 11, via 141 is formed in first insulation layer 111 and insulation layer 134 of flexible substrate 13. In the interior of via 141, conductive pattern 142 is formed and connected to extended pattern 143 formed on first insulation layer 111. Conductive pattern 142 and extended pattern 143 are formed by patterning a copper-plated layer.

On first insulation layer 111, third and fourth upper-layer insulation layers 144, 145 are laminated. In third and fourth upper-layer insulation layers 144, 145, vias 146, 147 are formed respectively. Vias 146, 147 are filled with conductors 148, 149. Conductive pattern 150 is formed on fourth upper-layer insulation layer 145.

Figure 12A:
FIGS. 12A and 12B are views to illustrate an example in which the density of conductors in a flex-rigid printed wiring board is higher than the density of conductors in a main substrate.
Figure 12B:
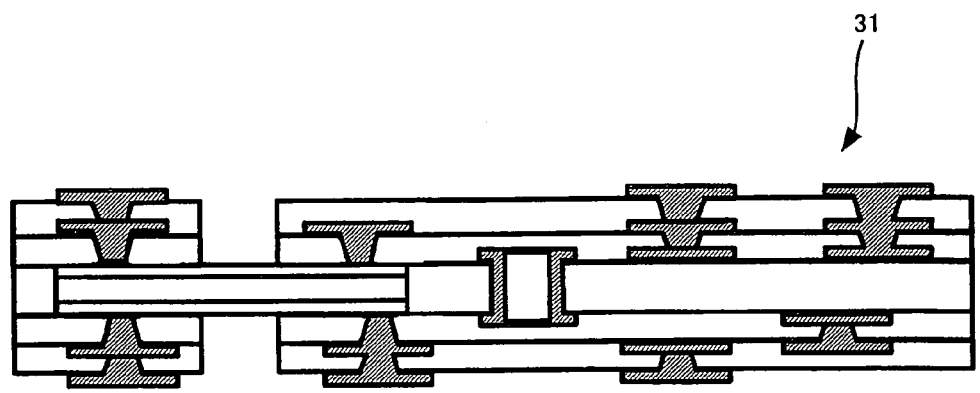

The structure shown in FIG. 1, as an example in which the number of wiring layers having conductive patterns in flex-rigid printed wiring board 31 is greater than the number of wiring layers in a region of main substrate 21 that has the same thickness as the flex-rigid substrate, an example was shown in which the main substrate has two (2) layers and flex-rigid wiring board 31 has six (6) layers. However, the present invention is not limited to such. The number itself of the wiring layers in flex-rigid printed wiring board 31 and main substrate 21 is optional. For example, as shown in FIG. 12, the number of wiring layers in flex-rigid printed wiring board 31 may be set at six (6) and that of main substrate 21 may be set at four 4.

Also, in the above structure, an example was shown in which the number of wiring layers having conductive patterns in flex-rigid printed wiring board 31 is made greater than the number of wiring layers in a region of main substrate 21 that has the same thickness as flex-rigid printed wiring board 31. Another example was also shown in which the existing density of conductive patterns on the insulation layers of flex-rigid printed wiring board 31 is made higher than the existing density of conductive patterns on the insulation layers of main substrate 21. However, the present invention is not limited to such. As shown in FIG. 12, the average number of vias per insulation layer formed in the flex-rigid printed wiring board may be set greater than the average number of vias per insulation layer of main substrate 21.

Figure 13A:
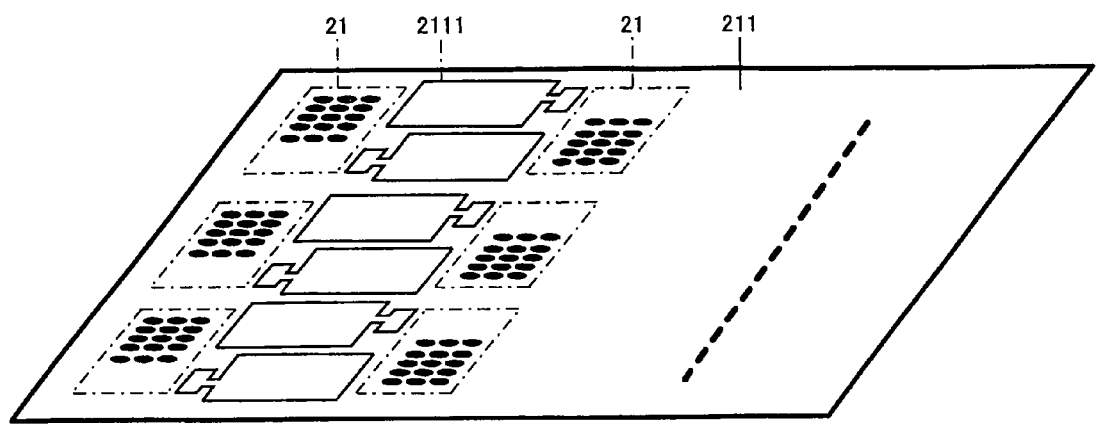
FIGS. 13A and 13B are perspective views to illustrate a modified example of the connection method between a flex-rigid wiring board and a main substrate.
Figure 13B:
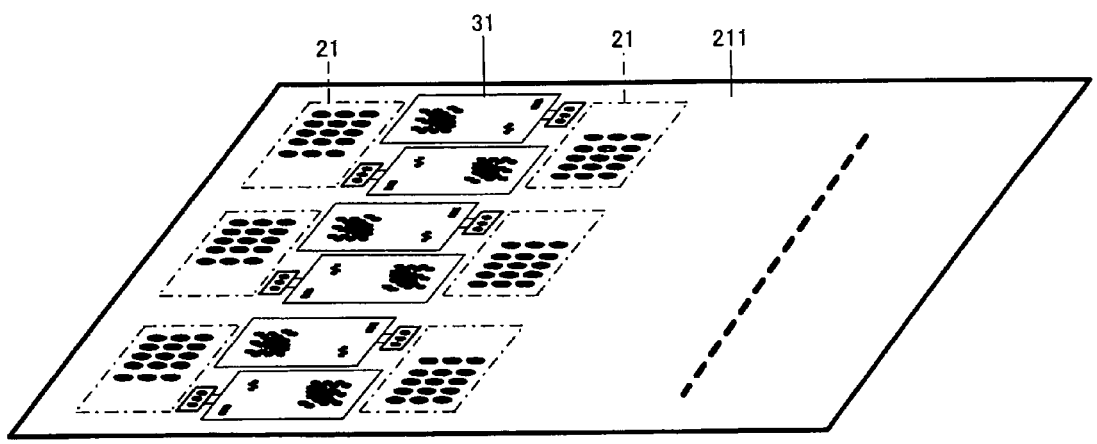

For example, in the above embodiment, during a manufacturing process, opening 211 is formed so as to fit into part of main substrate 21 as shown in FIG. 3B; then main substrate 21 and part of structure 371 are put together as shown in FIG. 3D. The present invention is not limited to such. For example, main substrate 21 and structure 371 may be arranged as shown in FIG. 13B. The manufacturing process after arranging in such a way is the same as in the above embodiment.

Figure 14A:
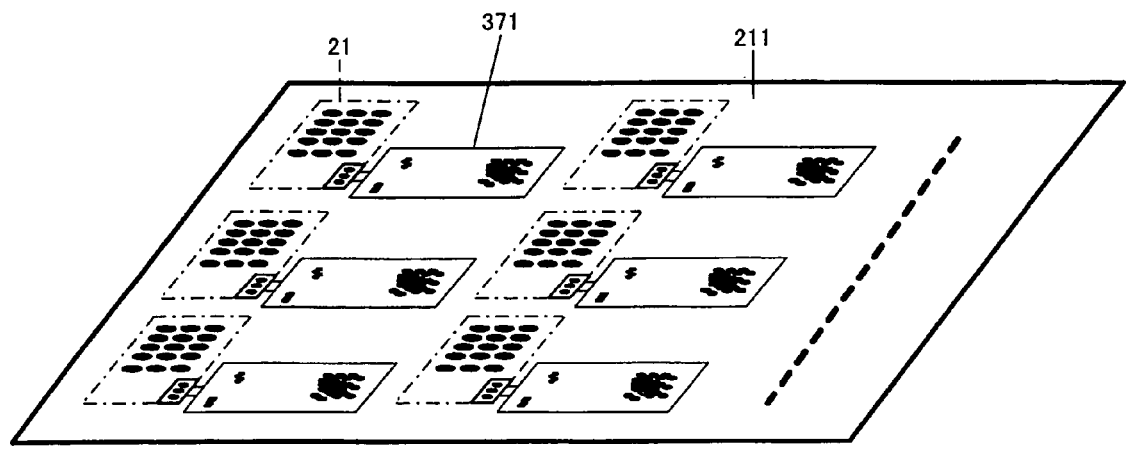
FIGS. 14A and 14B are perspective views to illustrate modified examples of the connection method between a flex-rigid wiring board and a main substrate.
Figure 14B:
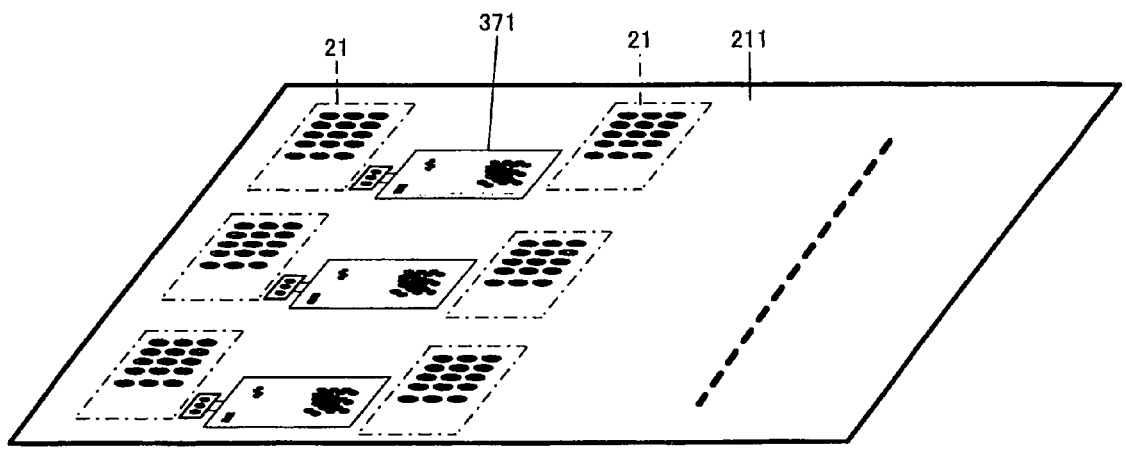

For example, during a manufacturing step in the above embodiment, to use the substrate effectively, adjacent main substrates are lined up to face in opposite directions and openings 211 are arranged alternately as shown in FIGS. 3A, 3B, 3D, 13A and 13B. Accordingly, main substrates 21 and structures 371 are put together densely. The present invention is not limited to such. For example, as shown in FIGS. 14A and 14B, multiple main substrates 21, multiple openings 211 and multiple structures 371 may be arranged regularly to face the same direction.

Figure 15:
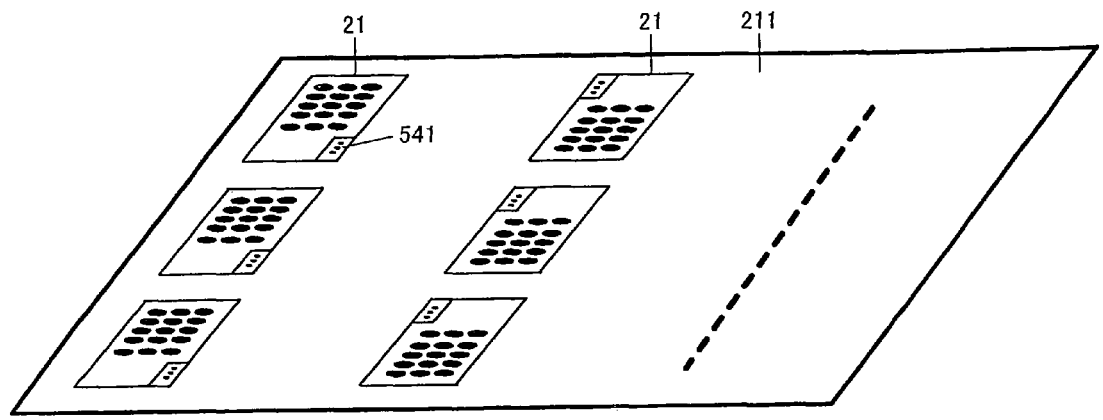
FIGS. 15, 16 and 17 are perspective views to illustrate modified examples of the connection method between a flex-rigid wiring board and a main substrate.
Figure 16:
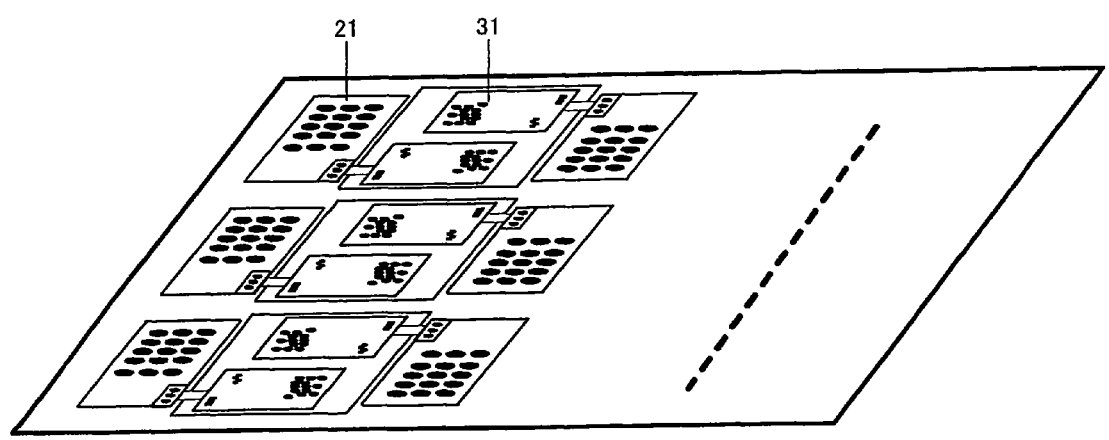
Figure 17:
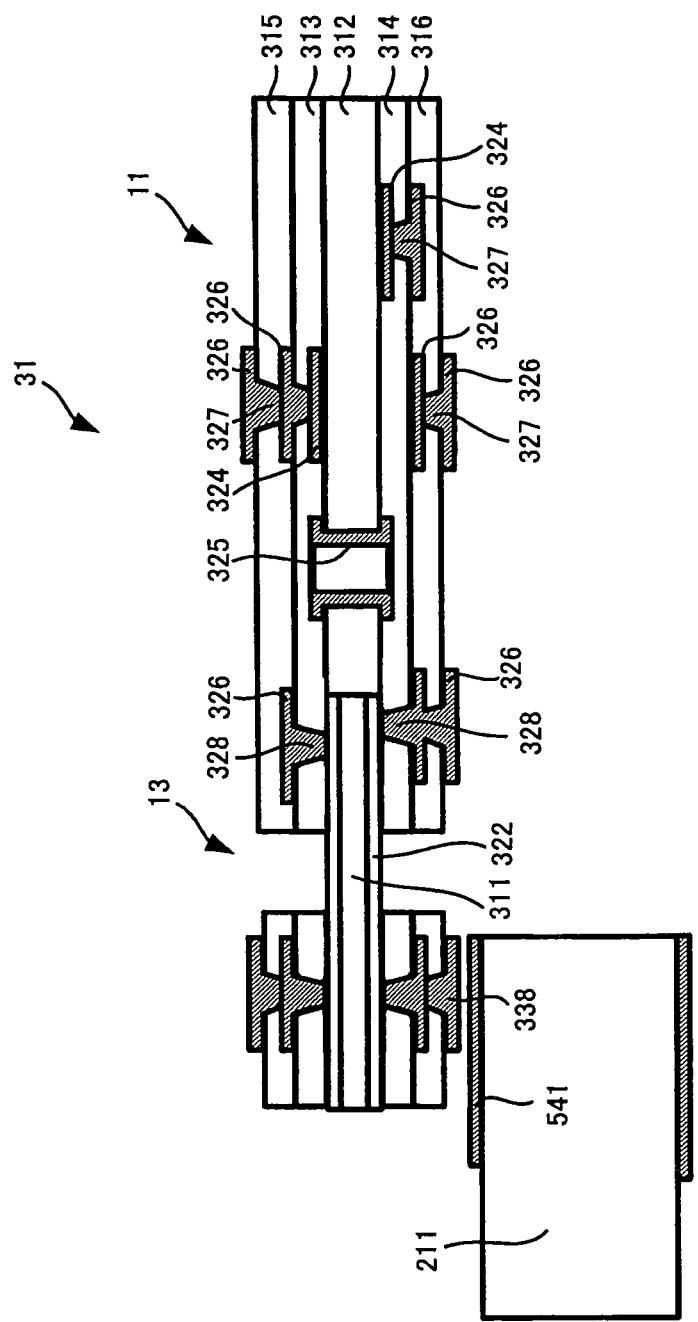

Also, the method for connecting main substrate 21 and flex-rigid wiring board 31 is optional as well. For example, a procedure such as the following may also be conducted: connection pad 541 is arranged on main substrate 21 as shown in FIG. 15, joint section 15 of flex-rigid wiring board 31 is placed on connection pad 541 as shown in FIG. 16, and connection pad 541 and connection pad 538 on joint section 15 are connected as shown in FIG. 17.

Also, the process to manufacture multilayer wiring board 1 is not limited to the above embodiment, but may be modified. For example, a manufacturing process may also be employed in which flex-rigid wiring board 31 is completed first and then is put together with main substrate 21.

Figure 18E:
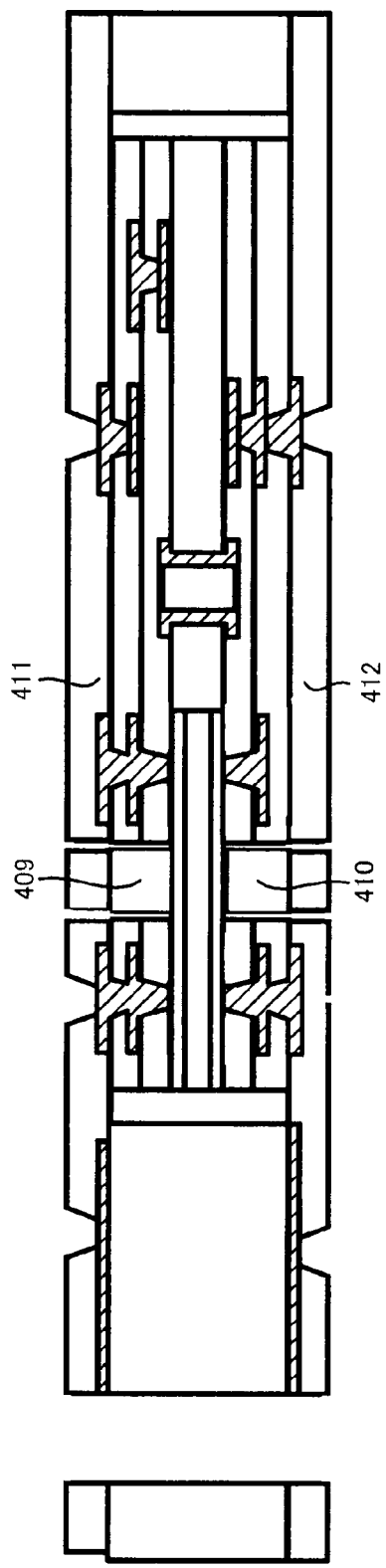

In such a case, for example, after structure 371 shown in FIG. 5I is completed, laser (L) is beamed, for example, as shown in FIG. 18A, to cut unnecessary portions of prepregs 403, 404, 406, 407. At that time, flex-rigid printed wiring board 31 as shown in FIG. 2B may also be completed after flex-rigid printed wiring board 31 is separated from its surroundings and then the unnecessary portions of the prepregs are removed.

In such a case, then, flex-rigid wiring board 31 is arranged in opening 2111 adjacent to defect-free main substrate 21 as shown in FIG. 18B. In the following, it is preferred that separators 409, 410 be disposed on the top and bottom surfaces of flexible substrate 13 in flex-rigid printed wiring board 31 as shown in FIG. 18B. Then, as shown in FIG. 18B, prepregs 411, 412 are disposed on the top and bottom surfaces of multiple combinations of main substrate 21 and structure 371, and pressed. Furthermore, the resin is cured.

Then, by beaming a laser or the like, vias 413 are properly formed in cured prepregs 411, 412 as shown in FIG. 18D. Also, through-hole 414 is formed using a drill or the like.

Figure 18F:
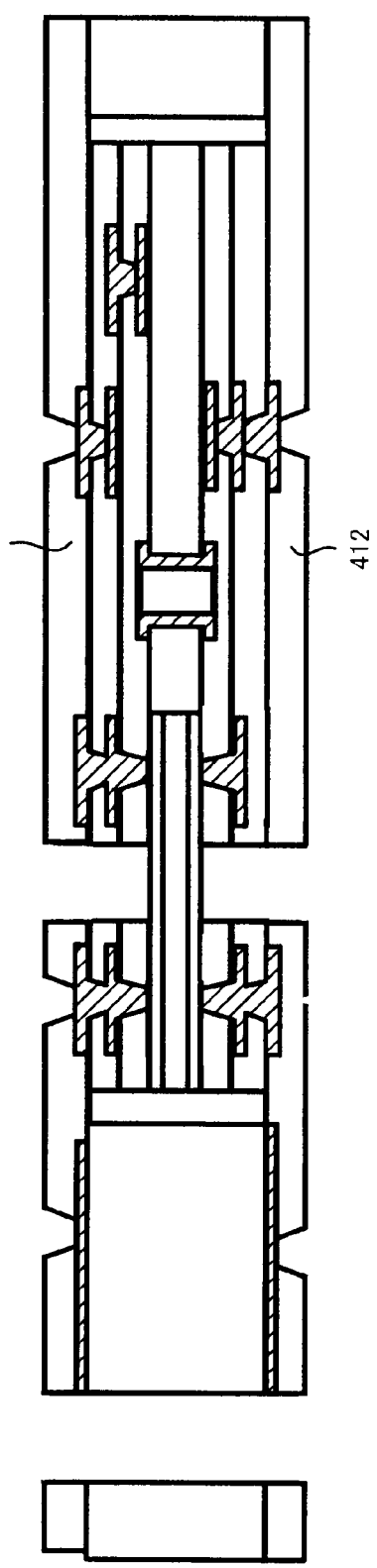

In the following, laser (L) is beamed at the portions of cured prepregs 411, 412, which correspond to the edges of separators 409, 410 to cut prepregs 411, 412 as shown in FIG. 18F. Then, cut portions of prepregs 406, 407 and separators 409, 410 are removed.

Then, by plating on the entire structure and patterning it, multilayer wiring board 1 with the structure shown in FIG. 1 is completed.

Manufacturing productivity may also be increased in such modifications and applications, compared with cases in which the entire structure is manufactured collectively as a whole, and loss of material or energy may be reduced.

In the above embodiment, joint section 15 is arranged in flex-rigid wiring board 31. However, conductors 321, 322 on flexible substrate 13 may be directly connected to other circuits without arranging joint section 15.

A wiring board according to one embodiment of the present invention includes the following: a wiring board is made up of a main substrate having a conductive pattern formed on a base material, and a flex-rigid printed wiring board structured with at least a rigid substrate and a flexible substrate connected to each other, which is arranged in the main substrate and has a conductive pattern formed on at least either the rigid substrate or the flexible substrate; and the conductive pattern of the main substrate is electrically connected to the conductive pattern of the flex-rigid printed wiring board.

The conductive pattern of the flex-rigid printed wiring board is electrically connected to, for example, a surface of the conductive pattern formed on the main substrate.

For example, at least part of the flex-rigid printed wiring board is inserted in the main substrate, and the conductive pattern of the main substrate and the conductive pattern of the flex-rigid printed wiring board are electrically connected at the insertion point.

For example, at least part of the flex-rigid wiring board is embedded in the main substrate, and the conductive pattern of the main substrate and the conductive pattern of the flex-rigid printed wiring board are electrically connected at the embedded point.

The flex-rigid printed wiring board has, for example, a flexible base material having a conductive pattern, a non-flexible base material positioned horizontal to the flexible base material, an insulation layer covering at least part of the flexible base material and at least part of the non-flexible base material while exposing at least part of the flexible base material, and a conductive pattern formed on the insulation layer. The conductive pattern of the flexible base material and the conductive pattern on the insulation layer are connected through plating.

The flex-rigid printed wiring board has, for example, a flexible base material having a conductive pattern, a non-flexible base material positioned horizontal to the flexible base material, and an insulation layer covering at least part of the flexible base material and at least part of the non-flexible base material while exposing at least part of the flexible base material. A via is formed in the insulation layer and a conductive pattern is formed on the insulation layer. The conductive pattern on the insulation layer is connected to the conductive pattern of the flexible base material through the via.

The flex-rigid printed wiring board has, for example, a flexible base material having a conductive pattern and a protective layer covering the conductive pattern, a non-flexible base material positioned horizontal to the flexible base material, an insulation layer covering at least part of the flexible base material and at least part of the non-flexible base material while exposing at least part of the flexible base material, and a conductive pattern formed on the insulation layer. The conductive pattern of the flexible base material and the conductive pattern on the insulation layer are connected to the conductive pattern of the flexible base material through a via formed in the insulation layer and the protective layer.

For example, the number of layers of conductive patterns in the rigid section of the flex-rigid printed wiring board is set greater than the number of layers of conductive patterns in the area of the main substrate that has the same thickness as the rigid section of the flex-rigid printed wiring board.

For example, in the main substrate, multiple conductive patterns are laminated with insulation layers in between, and vias are formed in the insulation layers to connect the conductive patterns with each other. In the flex-rigid wiring board, multiple conductive patterns are laminated with insulation layers in between, vias are formed in the insulation layers to connect the conductive patterns with each other, and the existing density of conductive patterns is set higher than that in the main substrate. The average number of vias per insulation layer formed in the flex-rigid printed wiring board is set greater than the average number of vias per insulation layer of the main substrate.

For example, the existing density of conductive patterns on the insulation layers of the flex-rigid substrate is set higher than the existing density of conductive patterns on the insulation layers of the main substrate.

A method for manufacturing a wiring board according to one embodiment of the present invention includes a step to form a main substrate having a conductive pattern formed on a base material; a step to form a flex-rigid printed wiring board structured with at least a rigid substrate and a flexible substrate connected with each other, which is arranged in the main substrate and has a conductive pattern formed on at least either the rigid substrate or the flexible substrate; and a step to electrically connect the conductive pattern of the main substrate and the conductive pattern of the flex-rigid printed wiring board.

For example, the step to form a main substrate includes a step to form a connection pad on a surface of the main substrate; the step to form a flex-rigid printed wiring board includes a step to form a connection pad on a surface of the flex-rigid printed wiring board; and the connection step includes a step to connect the connection pad of the main substrate and the connection pad of the flex-rigid printed wiring board by arranging the flex-rigid printed wiring board on the main substrate.

For example, the step to form a main substrate includes a step to form an inset section at a surface of the main substrate to inset the flex-rigid printed wiring board and to form a connection pad in the inset section; the step to form a flex-rigid printed wiring board includes a step to form a connection pad on a surface of the flex-rigid printed wiring board; and the connection step includes a step to inset part of the flex-rigid printed wiring board in the inset section of the main substrate and to connect the connection pad of the main substrate and the connection pad of the flex-rigid printed wiring board.

For example, the step to form a main substrate includes a step to form an embedding section at a surface of the main substrate to embed the flex-rigid printed wiring board and to form a connection pad in the embedding section; the step to form a flex-rigid printed wiring board includes a step to form a connection pad on a surface of the flex-rigid printed wiring board; and the connection step includes a step to embed the flex-rigid printed wiring board in the embedding section of the main substrate and to connect the connection pad of the main substrate and the connection pad of the flex-rigid printed wiring board.

For example, the step to form a flex-rigid printed wiring board includes a step to arrange a flexible base material having a conductive pattern side by side with a non-flexible base material; a covering step to cover with an insulation layer at least part of the flexible base material and at least part of the non-flexible base material while exposing at least part of the flexible base material; a step to form a conductive pattern on the insulation layer; and a step to connect through plating the conductive pattern of the flexible base material and the conductive pattern on the insulation material.

For example, the following steps may also be conducted: a step to position a flexible base material having a conductive pattern to be horizontal to a non-flexible base material; a step to arrange an insulation layer to cover at least part of the flexible base material and at least part of the non-flexible base material while exposing at least part of the flexible base material; a step to form a via in the insulation layer; and a step to connect the conductive pattern on the insulation layer and the conductive pattern of the flexible base material through the via.

For example, the flex-rigid printed wiring board has a step to arrange a flexible base material, which has a conductive pattern and a protective layer covering the conductive pattern, to be horizontal to a non-flexible base material; a step to form an insulation layer to cover at least part of the flexible base material and at least part of the non-flexible base material while exposing at least part of the flexible base material; a step to form a via in the insulation layer and the protective layer; and a step to connect through the via the conductive pattern of the flexible base material and the conductive pattern on the insulation layer.

For example, the number of layers of conductive patterns in the rigid section of the flex-rigid printed wiring board is set greater than the number of layers of conductive patterns in a region of the main substrate that has the same thickness and size as the rigid section of the flex-rigid printed wiring board.

For example, in the main substrate, multiple conductive patterns are laminated with insulation layers in between and vias are formed in the insulation layers to connect the conductive patterns with each other. In the flex-rigid insulation layers, multiple conductive patterns are laminated with insulation layers in between, vias are formed in the insulation layers to connect the conductive patterns with each other, and the existing density of conductive patterns is set higher than that in the main substrate. The average number of vias per insulation layer formed in the flex-rigid printed wiring board is set greater than the average number of vias per insulation layer in the main substrate.

For example, the existing density of conductive patterns on the insulation layers of the flex-rigid substrate is set higher than the existing density of conductive patterns on the insulation layers of the main substrate.

According to a wiring board having the above structure and its manufacturing method, main substrates and flex-rigid substrates may be manufactured separately and then put together. As a result, productivity may be maintained at a high level.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
   a main substrate having a base material and a conductive pattern formed on the base material;
   a flex-rigid printed wiring board having an end portion positioned beside the main substrate and having a rigid substrate and a flexible substrate connected to each other, the end portion being connected to the rigid substrate by the flexible substrate, and the flex-rigid printed wiring board having a conductive pattern formed on a surface of the end portion of the flex-rigid printed wiring board; and an insulation layer formed over the conductive pattern of the main substrate and the conductive pattern of the flexible-rigid wiring board, the insulation layer having a plurality of via conductors formed through the insulation layer and a conductive pattern formed on the insulation layer and directly connecting the via conductors, wherein the plurality of via conductors includes a via conductor connected to the conductive pattern of the main substrate and a via conductor connected to the conductive pattern formed on the surface of the end portion of the flex-rigid printed wiring board such that the conductive pattern of the main substrate is electrically connected to the conductive pattern of the flex-rigid printed wiring board through the conductive pattern formed on the insulation layer.

2. The wiring board according to claim 1, wherein the flexible substrate comprises a flexible base material and a conductive pattern, the rigid substrate comprises a non-flexible base material positioned horizontal to the flexible base material of the flexible substrate, the flex-rigid printed wiring board further comprises an insulation layer covering at least a portion of the flexible base material and at least a portion of the non-flexible base material while exposing at least a portion of the flexible base material, and a conductive pattern formed on the insulation layer of the flex-rigid printed wiring board, and the conductive pattern of the flexible substrate and the conductive pattern on the insulation layer are connected through plating.

3. The wiring board according to claim 1, wherein the flexible substrate comprises a flexible base material and a conductive pattern, the rigid substrate comprises a non-flexible base material positioned horizontal to the flexible base material of the flexible substrate, the flex-rigid printed wiring board further comprises an insulation layer covering at least a portion of the flexible base material and at least a portion of the non-flexible base material while exposing at least a portion of the flexible base material, a via structure formed in the insulation layer of the flex-rigid printed wiring board, and a conductive pattern formed on the insulation layer of the flex-rigid printed wiring board, and the conductive pattern on the insulation layer of the flex-rigid printed wiring board is connected to the conductive pattern of the flexible substrate through the via structure.

4. The wiring board according to claim 1, wherein the flexible substrate comprises a flexible base material, a conductive pattern and a protective layer covering the conductive pattern, the rigid substrate comprises a non-flexible base material positioned horizontal to the flexible base material of the flexible substrate, the flex-rigid printed wiring board further comprises an insulation layer covering at least a portion of the flexible base material and at least a portion of the non-flexible base material while exposing at least a portion of the flexible base material, a conductive pattern formed on the insulation layer of the flex-rigid printed wiring board, and a via structure formed in the insulation layer of the flex-rigid printed wiring board and the protective layer, the conductive pattern of the flexible substrate and the conductive pattern on the insulation layer of the flex-rigid printed wiring board are connected through the via structure.

5. The wiring board according to claim 1, wherein the conductive pattern in the flex-rigid printed wiring board is formed in a plurality of layers, the conductive pattern in the main substrate is formed in a plurality of layers, the layers of the conductive pattern in the flex-rigid printed wiring board is set to have a greater number of layers than the layers of the conductive pattern formed in an area of the main substrate that has a same thickness as the flex-rigid printed wiring board.

6. The wiring board according to claim 1, wherein the main substrate comprises a plurality of insulation layers, a plurality of conductive patterns laminated between the insulation layers of the main substrate, and a plurality of via structures formed in the insulation layers of the main substrate and connecting the conductive patterns of the main substrate, the flex-rigid printed wiring board comprises a plurality of insulating layers, a plurality of conductive patterns laminated between the insulation layers of the flex-rigid printed wiring board, and a plurality of via structures formed in the insulation layers of the flex-rigid printed wiring board and connecting the conductive patterns of the flex-rigid printed wiring board, and the plurality of conductive patterns in the flex-rigid printed wiring board has an existing density which is set higher than an existing density of the plurality of conductive patterns in the main substrate, and the plurality of insulation layers in the flex-rigid printed wiring board has an average number of via structures per layer which is set greater than an average number of via structures per layer of the plurality of insulation layers in the main substrate.

7. The wiring board according to claim 1, wherein the main substrate comprises a plurality of insulation layers, a plurality of conductive patterns laminated between the insulation layers of the main substrate, and a plurality of via structures formed in the insulation layers of the main substrate and connecting the conductive patterns of the main substrate, the flex-rigid printed wiring board comprises a plurality of insulating layers, a plurality of conductive patterns laminated between the insulation layers of the flex-rigid printed wiring board, and a plurality of via structures formed in the insulation layers of the flex-rigid printed wiring board and connecting the conductive patterns of the flex-rigid printed wiring board, and the plurality of conductive patterns in the flex-rigid printed wiring board has an existing density which is set higher than an existing density of the plurality of conductive patterns in the main substrate.

8. A method for manufacturing a wiring board, comprising:
   forming a main substrate having a base material and a conductive pattern formed on the base material;
   forming a flex-rigid printed wiring board having an end portion provided beside the main substrate and comprising a rigid substrate and a flexible substrate connected with each other, the end portion being connected to the rigid substrate by the flexible substrate, and the flex-rigid printed wiring board having a conductive pattern formed on a surface of the end portion of the flex-rigid printed wiring board;
   forming an insulation layer over the conductive pattern of the main substrate and the conductive pattern of the flexible-rigid wiring board;
   forming a plurality of via conductors through the insulation layer including a via conductor connected to the conductive pattern of the main substrate and a via conductor connected to the conductive pattern formed on the surface of the end portion of the flex-rigid printed wiring board; and
   forming on the insulation layer a conductive pattern directly connecting the via conductors such that the conductive pattern of the main substrate is electrically connected to the conductive pattern formed on the surface of the end portion of the flex-rigid printed wiring board through the conductive pattern formed on the insulation layer.

9. The method for manufacturing a wiring board according to claim 8, wherein the forming of the flex-rigid printed wiring board comprises arranging a flexible base material having a conductive pattern to be horizontal to a non-flexible base material, providing an insulation layer to cover at least a portion of the flexible base material and at least a portion of the non-flexible base material while exposing at least a portion of the flexible base material, forming a conductive pattern on the insulation layer of the flex-rigid printed wiring board, forming a via structure in the insulation layer of the flex-rigid printed wiring board, and connecting through the via structure the conductive pattern on the insulation layer and the conductive pattern of the flexible base material.

10. The method for manufacturing a wiring board according to claim 8, wherein the forming of the flex-rigid printed wiring board comprises arranging a flexible base material having a conductive pattern and a protective layer covering the conductive pattern to be horizontal to a non-flexible base material, forming an insulation layer to cover at least a part of the flexible base material and at least a portion of the non-flexible base material while exposing at least a portion of the flexible base material, forming a conductive pattern on the insulation layer of the flex-rigid printed wiring board, forming a via structure in the insulation layer of the flex-rigid printed wiring board and the protective layer, and connecting through the via structure the conductive pattern of the flexible base material and the conductive pattern on the insulation layer.

11. The method for manufacturing a wiring board according to claim 8, further comprising setting a number of layers of conductive patterns in the flex-rigid printed wiring board to be greater than a number of layers of conductive patterns in a region of the main substrate that has a same thickness and size as the flex-rigid printed wiring board, wherein the forming of the main substrate comprises forming the layers of the conductive patterns in the main substrate, and the forming of the flex-rigid printed wiring board comprises forming the layers of the conductive patterns in the flex-rigid printed wiring board.

12. The method for manufacturing a wiring board according to claim 8, further comprising setting an existing density of conductive patterns in the flex-rigid printed wiring board to be higher than an existing density of conductive patterns in the main substrate, and setting an average number of via structures per layer of insulation layers formed in the flex-rigid printed wiring board to be greater than an average number of via structures per layer of insulation layers in the main substrate, wherein the forming of the main substrate comprises forming the insulation layers, the conductive patterns laminated between the insulation layers, and the via structures formed in the insulation layers and connecting the conductive patterns in the main substrate, and the forming of the flex-rigid printed wiring board comprises forming the insulation layers, the conductive patterns laminated between the insulation layers, and the via structures formed in the insulation layers and connecting the conductive patterns in the flex-rigid printed wiring board.

13. The method for manufacturing a wiring board according to claim 8, further comprising setting an existing density of conductive patterns on insulation layers in the flex-rigid substrate to be higher than an existing density of conductive patterns on insulation layers of the main substrate, wherein the forming of the main substrate comprises forming the insulation layers and the conductive patterns laminated between the insulation layers, and the forming of the flex-rigid printed wiring board comprises forming the insulation layers and the conductive patterns laminated between the insulation layers.

14. The wiring board of claim 1, wherein the main substrate has greater rigidity than the end portion of the flexible-rigid wiring board.

15. The method for manufacturing a wiring board according to claim 8, further comprising:
   providing said base material of the main substrate having a predetermined rigidity; and
   providing said end portion of the flex-rigid printed wiring board having a rigidity less than said rigidity of the base material of the main substrate.

\* \* \* \* \*